(12) United States Patent
Hanaoka

(10) Patent No.: US 11,043,979 B2
(45) Date of Patent: Jun. 22, 2021

(54) TRANSMISSION DEVICE AND COMMUNICATION SYSTEM

(71) Applicant: SONY SEMICONDUCTOR SOLUTIONS CORPORATION, Kanagawa (JP)

(72) Inventor: Katsushi Hanaoka, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/635,225

(22) PCT Filed: May 10, 2018

(86) PCT No.: PCT/JP2018/018074
§ 371 (c)(1),
(2) Date: Jan. 30, 2020

(87) PCT Pub. No.: WO2019/031003
PCT Pub. Date: Feb. 14, 2019

(65) Prior Publication Data
US 2020/0373952 A1 Nov. 26, 2020

(30) Foreign Application Priority Data
Aug. 8, 2017 (JP) .............................. JP2017-153426

(51) Int. Cl.
*H04B 1/04* (2006.01)
*H04L 7/027* (2006.01)
(Continued)

(52) U.S. Cl.
CPC ........... *H04B 1/0475* (2013.01); *H04L 7/027* (2013.01); *H03L 7/0807* (2013.01); *H03M 9/00* (2013.01)

(58) Field of Classification Search
CPC ..................................................... H04B 1/0475
(Continued)

(56) References Cited

U.S. PATENT DOCUMENTS 5,448,231 A * 9/1995 Takezoe ................. H04B 3/548
307/1
6,317,343 B1 * 11/2001 Okamura ................ H02M 3/07
307/109
(Continued)

FOREIGN PATENT DOCUMENTS

JP 56-132035 A 10/1981
JP 2005-303590 A 10/2005
(Continued)

OTHER PUBLICATIONS

International Search Report and Written Opinion of PCT Application No. PCT/JP2018/018074, dated Aug. 7, 2018, 09 pages of ISRWO.

*Primary Examiner* — Lihong Yu
(74) *Attorney, Agent, or Firm* — Chip Law Group

(57) ABSTRACT

Provided is a transmission device including: a transmission circuit that operates, on the basis of a mode signal indicating a first operation mode corresponding to a data transmission period or a second operation mode corresponding to a data transmission pause period, in the first operation mode or the second operation mode, and transmits data in which a clock signal is embedded; and a power supply noise reduction circuit that reduces noise of a power supply that supplies power to the transmission circuit when switching is performed between the first operation mode and the second operation mode.

6 Claims, 16 Drawing Sheets

(51) Int. Cl.
*H03L 7/08* (2006.01)
*H03M 9/00* (2006.01)

(58) Field of Classification Search
USPC .......................................................... 375/296
See application file for complete search history.

(56) References Cited

U.S. PATENT DOCUMENTS

| | | |
|---|---|---|
| 8,669,828 B1 * | 3/2014 | Wong .................... H01L 23/642 |
| | | 333/12 |
| 10,141,840 B2 * | 11/2018 | Cao ........................ H02M 3/156 |
| 2005/0226359 A1 | 10/2005 | Uehara |
| 2010/0109788 A1 | 5/2010 | Matsumoto et al. |
| 2012/0194225 A1 | 8/2012 | Shirai et al. |
| 2015/0234774 A1 * | 8/2015 | Sengoku ............. G06F 13/4291 |
| | | 710/106 |

FOREIGN PATENT DOCUMENTS

| | | |
|---|---|---|
| JP | 2007-166159 A | 6/2007 |
| JP | 2008-219718 A | 9/2008 |
| JP | 2012-156616 A | 8/2012 |
| JP | 2012-160990 A | 8/2012 |
| KR | 10-2009-0121305 A | 11/2009 |
| TW | 200849906 A | 12/2008 |
| WO | 2008/108195 A1 | 9/2008 |

\* cited by examiner

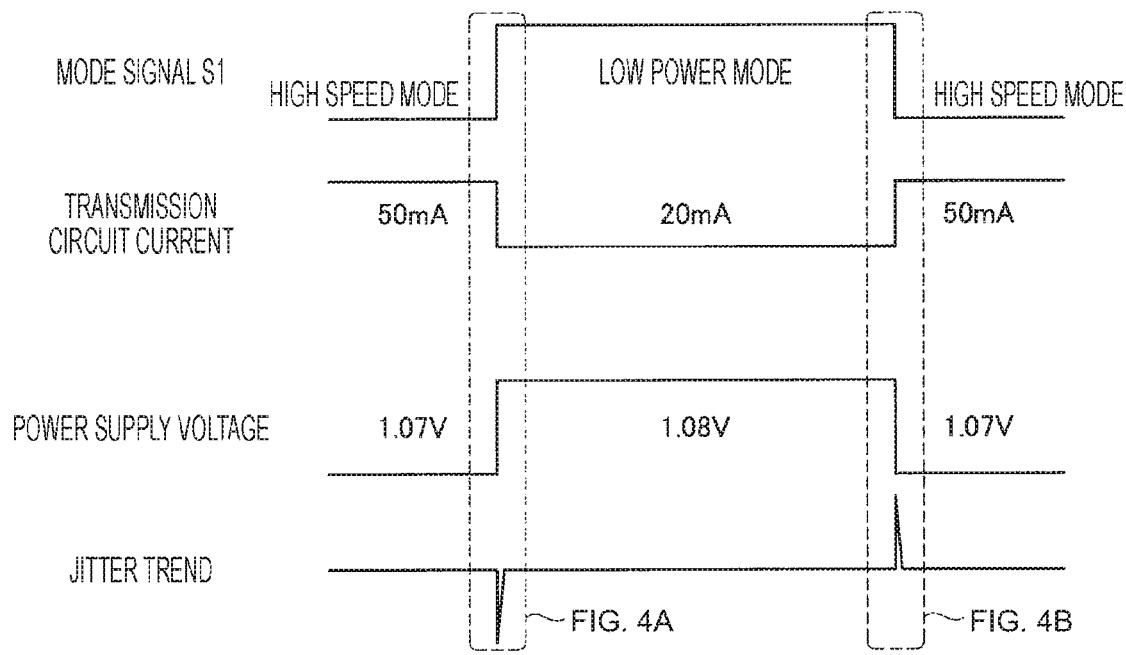
FIG. 5
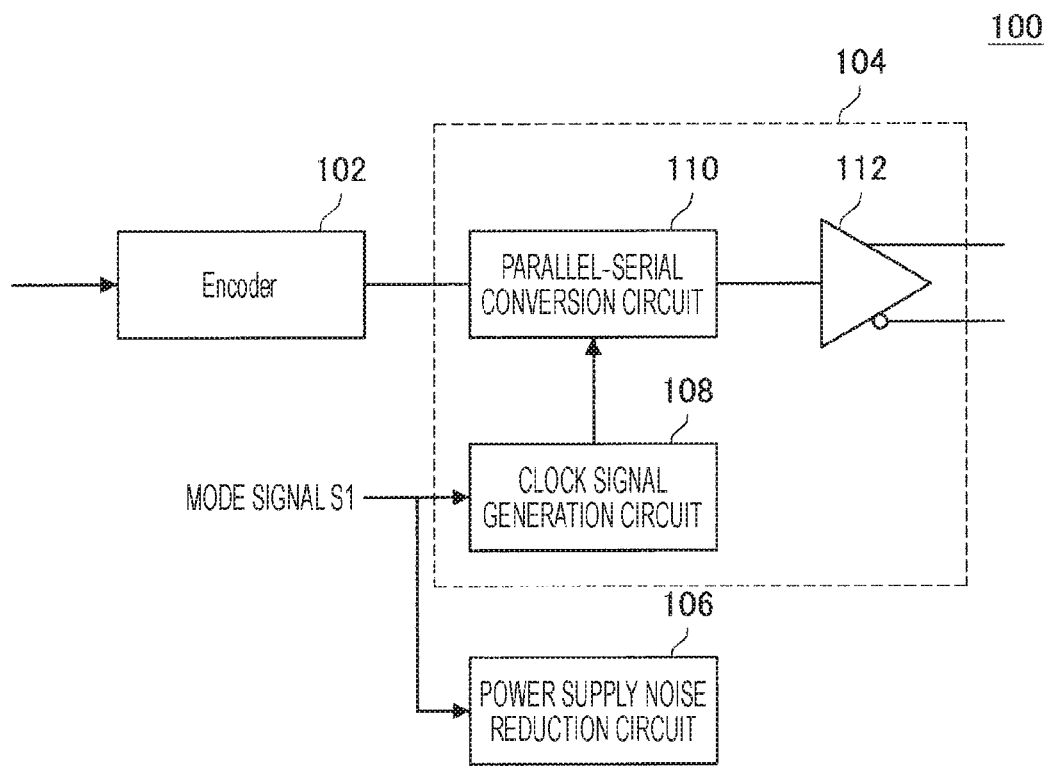

FIG. 6
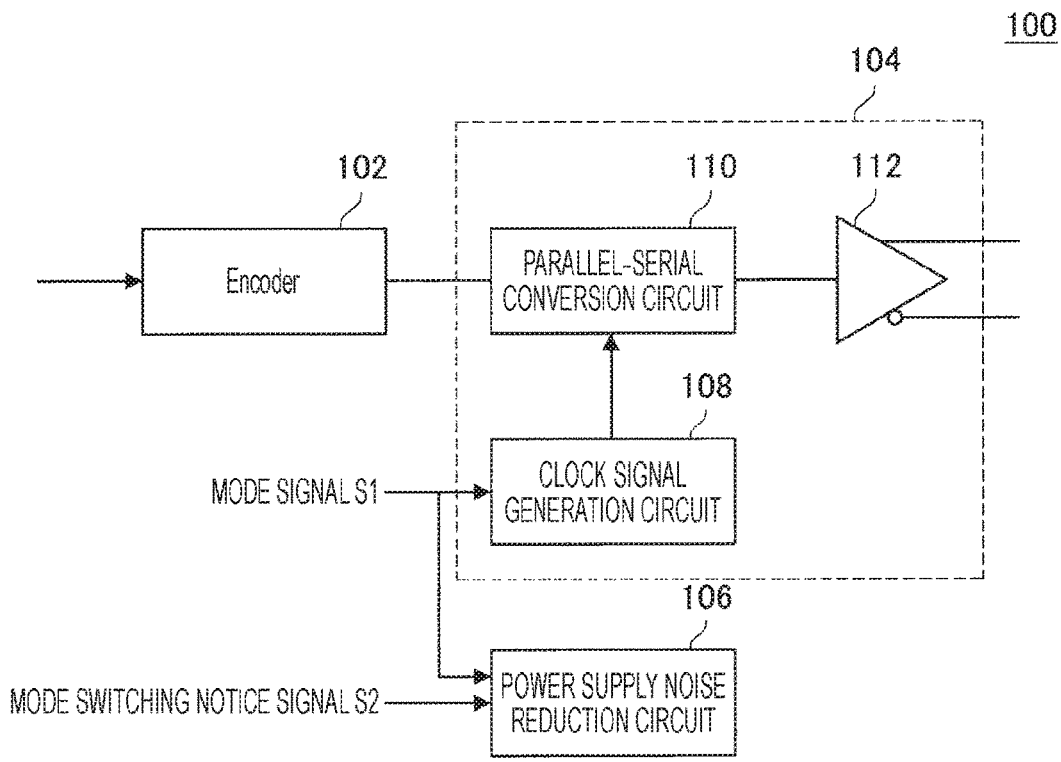
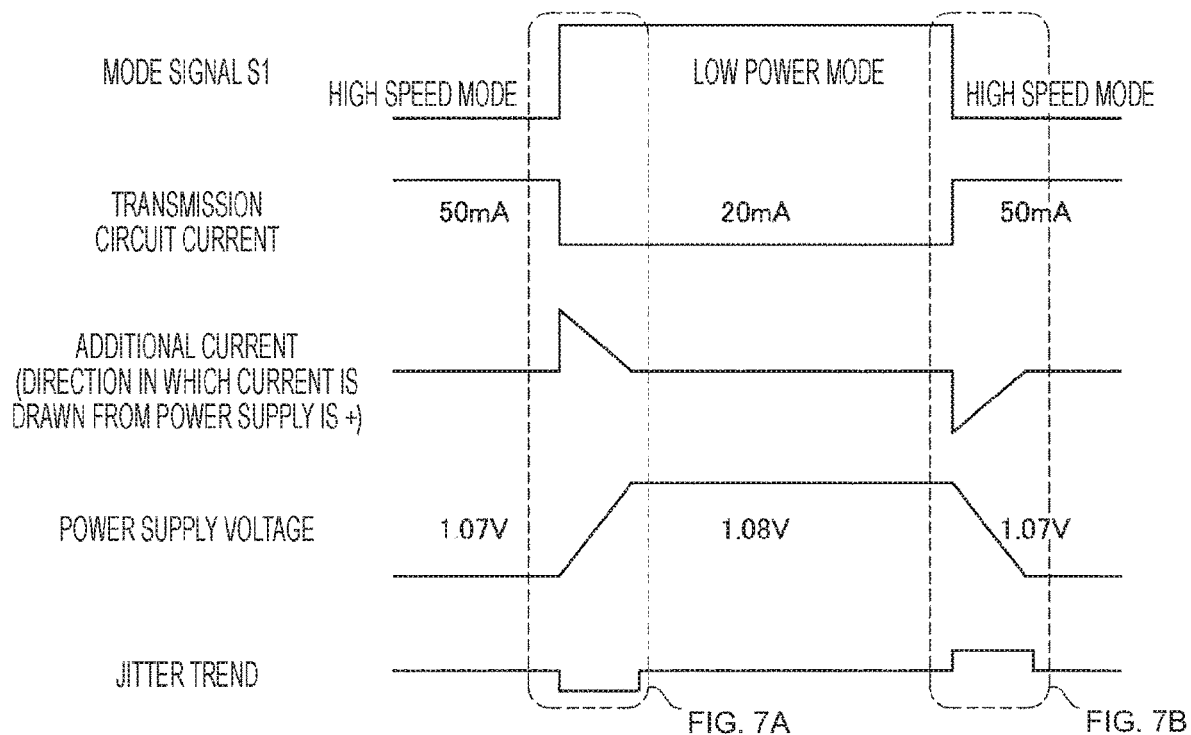
FIG. 7A    FIG. 7B

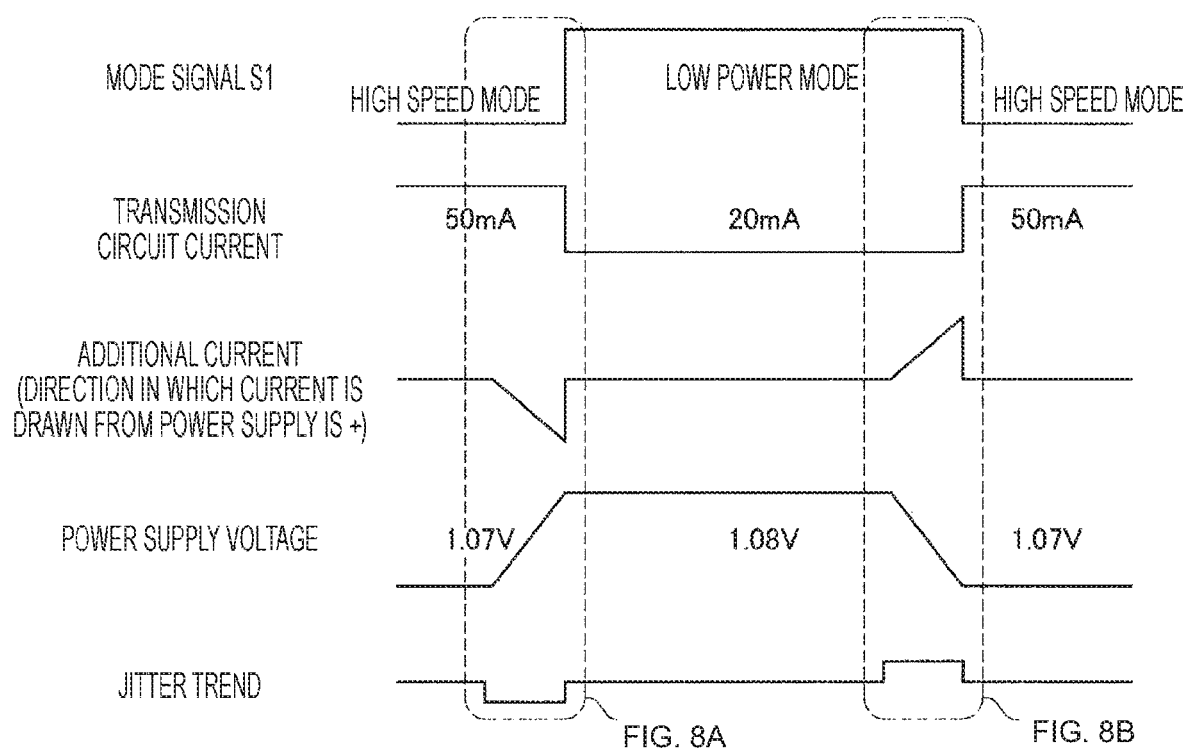

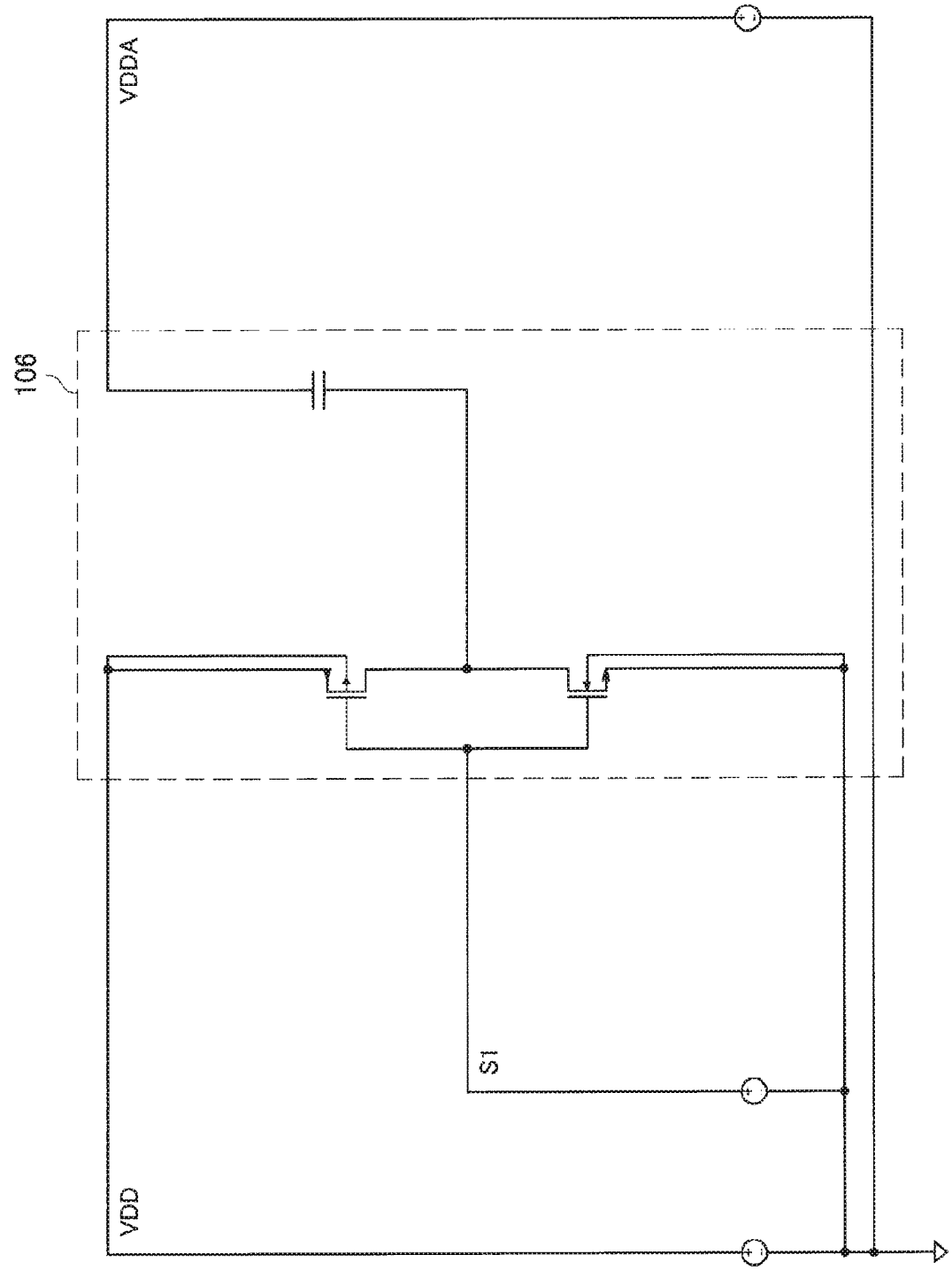

FIG. 18

| MAJOR ITEM | MINOR ITEM | AMOUNT OF INFORMATION | CONTENT |
|---|---|---|---|
| FRAME INFORMATION | Frame Start | 1bit | INDICATE FRAME HEAD (EXAMPLE: FIRST LINE) |
| | Frame End | 1bit | INDICATE FRAME END (EXAMPLE: REAR DUMMY FRONT LINE) |
| LINE INFORMATION | Line Valid | 1bit | INDICATE VALID/INVALID OF LINE |
| | Line Number | 13bit | INDICATE LINE NUMBER |
| OTHER | Reserved | 32bit | RESERVED FOR FUTURE EXPANDABILITY |
| | Header ECC | 18byte | ECC OF HEADER INFORMATION |

FIG. 19

| Byte | Bit | Contents | |
|---|---|---|---|
| H1 | 15 | CRC [15] | X^15 |
| H1 | 14 | CRC [14] | X^14 |
| H1 | 13 | CRC [13] | X^13 |
| H1 | 12 | CRC [12] | X^12 |
| H1 | 11 | CRC [11] | X^11 |
| H1 | 10 | CRC [10] | X^10 |
| H1 | 9 | CRC [9] | X^9 |
| H1 | 8 | CRC [8] | X^8 |
| H0 | 7 | CRC [7] | X^7 |
| H0 | 6 | CRC [6] | X^6 |
| H0 | 5 | CRC [5] | X^5 |
| H0 | 4 | CRC [4] | X^4 |
| H0 | 3 | CRC [3] | X^3 |
| H0 | 2 | CRC [2] | X^2 |
| H0 | 1 | CRC [1] | X^1 |
| H0 | 0 | CRC [0] | X^0 |

| Byte | Bit | Contents |
|---|---|---|
| H3 | 31 | Reserved [15] |
| H3 | 30 | Reserved [14] |
| H3 | 29 | Reserved [13] |
| H3 | 28 | Reserved [12] |
| H3 | 27 | Reserved [11] |
| H3 | 26 | Reserved [10] |
| H3 | 25 | Reserved [9] |
| H3 | 24 | Reserved [8] |
| H2 | 23 | Reserved [7] |
| H2 | 22 | Reserved [6] |
| H2 | 21 | Reserved [5] |
| H2 | 20 | Reserved [4] |
| H2 | 19 | Reserved [3] |
| H2 | 18 | Reserved [2] |
| H2 | 17 | Reserved [1] |
| H2 | 16 | Reserved [0] |

| Byte | Bit | Contents |
|---|---|---|
| H5 | 47 | Reserved [31] |
| H5 | 46 | Reserved [30] |
| H5 | 45 | Reserved [29] |
| H5 | 44 | Reserved [28] |
| H5 | 43 | Reserved [27] |
| H5 | 42 | Reserved [26] |
| H5 | 41 | Reserved [25] |
| H5 | 40 | Reserved [24] |
| H4 | 39 | Reserved [23] |
| H4 | 38 | Reserved [22] |
| H4 | 37 | Reserved [21] |
| H4 | 36 | Reserved [20] |
| H4 | 35 | Reserved [19] |
| H4 | 34 | Reserved [18] |
| H4 | 33 | Reserved [17] |
| H4 | 32 | Reserved [16] |

| Byte | Bit | Contents |
|---|---|---|
| H7 | 63 | Frame Start |
| H7 | 62 | Frame End |
| H7 | 61 | Line Valid |
| H7 | 60 | Line Number [12] |
| H7 | 59 | Line Number [11] |
| H7 | 58 | Line Number [10] |
| H7 | 57 | Line Number [9] |
| H7 | 56 | Line Number [8] |
| H6 | 55 | Line Number [7] |
| H6 | 54 | Line Number [6] |
| H6 | 53 | Line Number [5] |
| H6 | 52 | Line Number [4] |
| H6 | 51 | Line Number [3] |
| H6 | 50 | Line Number [2] |
| H6 | 49 | Line Number [1] |
| H6 | 48 | Line Number [0] |

TRANSMISSION DEVICE AND COMMUNICATION SYSTEM

CROSS REFERENCE TO RELATED APPLICATIONS

This application is a U.S. National Phase of International Patent Application No. PCT/JP2018/018074 filed on May 10, 2018, which claims priority benefit of Japanese Patent Application No. JP 2017-153426 filed in the Japan Patent Office on Aug. 8, 2017. Each of the above-referenced applications is hereby incorporated herein by reference in its entirety.

TECHNICAL FIELD

The present disclosure relates to a transmission device and a communication system.

BACKGROUND ART

Technologies have been developed for reducing power supply noise in digital amplifiers. An example of a technology for reducing power supply noise of a digital amplifier caused by a regenerative current of an inductor of a low pass filter is a technology described in Patent Document 1 below.

CITATION LIST

Patent Document

Patent Document 1: Japanese Patent Application Laid-Open No. 2012-156616

SUMMARY OF THE INVENTION

Problems to be Solved by the Invention

In a communication system that includes a transmission device and a reception device and in which communication is performed of an embedded clock method using clock data recovery (CDR) for reception synchronization, as one method of reducing power consumed in the transmission device, for example, a method described below can be considered.

A method of performing switching between a high speed mode corresponding to a data transmission period and a low power mode corresponding to a data transmission pause period and lower in power consumption than the high speed mode However, when switching is performed between the high speed mode and the low power mode in the transmission device, current consumption in the transmission device changes, so that a power supply voltage of the transmission device fluctuates. Furthermore, when the power supply voltage of the transmission device fluctuates, there is a possibility that a large jitter occurs in a signal transmitted by the transmission device due to the influence of the fluctuation of the power supply voltage. Then, in a case where the large jitter occurs in the signal transmitted by the transmission device, the CDR cannot follow in the reception device, and an error occurs.

Here, as a method of preventing the situation that occurs in the one method described above, for example, "a method in which the transmission device stops transmission of the signal during the pause period and starts the transmission of the signal after the pause period has elapsed" is conceivable.

However, in a case where "the method of preventing the situation that occurs in the one method" as described above is used, data cannot be transmitted efficiently due to reasons as described below.

It takes time for a direct current (DC) potential to return to a level before the pause when the transmission of the signal is resumed after the pause period has elapsed.

After the transmission of the signal is resumed in the transmission device, it takes time for synchronization in a CDR circuit in the reception device.

The present disclosure devises a new and improved transmission device and communication system capable of achieving low power consumption while maintaining CDR synchronization in the reception device.

Solutions to Problems

According to the present disclosure, a transmission device is provided including: a transmission circuit that operates, on the basis of a mode signal indicating a first operation mode corresponding to a data transmission period or a second operation mode corresponding to a data transmission pause period, in the first operation mode or the second operation mode, and transmits data in which a clock signal is embedded; and a power supply noise reduction circuit that reduces noise of a power supply that supplies power to the transmission circuit when switching is performed between the first operation mode and the second operation mode.

Furthermore, according to the present disclosure, a communication system is provided including: a transmission device that transmits data in which a clock signal is embedded; and a reception device including a clock data recovery (CDR) circuit that extracts the clock signal from the data received and generates a synchronized clock signal synchronized with the clock signal extracted, in which the transmission device includes a transmission circuit that operates, on the basis of a mode signal indicating a first operation mode corresponding to a data transmission period or a second operation mode corresponding to a data transmission pause period, in the first operation mode or the second operation mode, and transmits the data in which the clock signal is embedded, and a power supply noise reduction circuit that reduces noise of a power supply that supplies power to the transmission circuit when switching is performed between the first operation mode and the second operation mode.

Effects of the Invention

According to the present disclosure, it is possible to achieve low power consumption while maintaining CDR synchronization in the reception device.

Note that, the above-described effect is not necessarily limited, and, in addition to the above-described effect, or in place of the above-described effect, any of effects described in the present specification, or other effects that can be grasped from the present specification may be exhibited.

BRIEF DESCRIPTION OF DRAWINGS

FIGS. 4A and 4B are explanatory diagrams illustrating an operation example when switching of the operation mode is performed in the transmission device illustrated in FIG. 3.

FIG. 5 is an explanatory diagram illustrating a configuration example of a transmission device according to the present embodiment.

FIG. 6 is an explanatory diagram illustrating another example of the configuration of the transmission device according to the present embodiment.

FIGS. 7A and 7B are explanatory diagrams illustrating a first example of operation of the transmission device when switching of the operation mode is performed.

FIGS. 8A and 8B are explanatory diagrams illustrating a second example of the operation of the transmission device when switching of the operation mode is performed.

FIG. 13 is an explanatory diagram illustrating another example of the configuration of the power supply noise reduction circuit included in the transmission device according to the present embodiment.

FIG. 18 is an explanatory diagram for explaining various data included in the header illustrated in FIG. 17.

FIG. 19 is an explanatory diagram illustrating an example of a bit arrangement constituting one set of header information and a CRC code.

MODE FOR CARRYING OUT THE INVENTION

Preferred embodiments of the present disclosure will be described in detail below with reference to the accompanying drawings. Note that, in the present specification and the drawings, constituents having substantially the same functional configuration are denoted by the same reference signs, and redundant explanations will be omitted.

Figure 1:
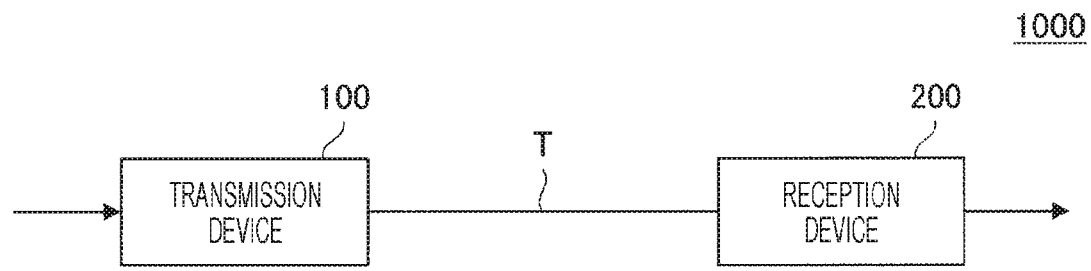
FIG. 1 is an explanatory diagram illustrating a configuration example of a communication system according to the present embodiment.

Furthermore, hereinafter, description will be made in the following order.
1. Communication system according to the present embodiment
[1] Communication system according to the present embodiment
[2] Effects exhibited in communication system according to the present embodiment
[3] Application example of communication system according to the present embodiment
(Communication System According to the Present Embodiment)
[1] Communication System According to the Present Embodiment FIG. 1 is an explanatory diagram illustrating a configuration example of a communication system 1000 according to the present embodiment. The communication system 1000 includes, for example, a transmission device 100 and a reception device 200.

The transmission device 100 and the reception device 200 perform data transmission/reception via a transmission path T, for example.

The communication system 1000 is applied to arbitrary serial communication of an embedded clock method using CDR for reception synchronization capable of performing wired or wireless communication, for example, Peripheral Component Interconnect (PCI) Express, Universal Serial Bus (USB) 3.x, Display Port, Mobile Industry Processor Interface (MIPI) M-PHY, VbyOne, Scalable Low Voltage Signaling with Embedded Clock (SLVS-EC), and the like. That is, examples of the transmission path T include an arbitrary transmission path used in serial communication of the embedded clock method using CDR for reception synchronization. An application example of the communication system according to the present embodiment will be described later.

Hereinafter, a configuration example will be described of each of the transmission device 100 and the reception device 200, with an example case where the transmission path T is a differential signal line, and the transmission device 100 and the reception device 200 perform data transmission/reception using differential signals.

[1-1] Reception Device 200

The reception device 200 is a device having a function of receiving data transmitted from the transmission device 100. The reception device 200 includes at least a CDR circuit that extracts a clock signal from the data received and generates a synchronized clock signal synchronized with the clock signal extracted.

Furthermore, the reception device 200 may decode the data transmitted from the transmission device 100 on the basis of the synchronized clock signal, for example. The decoded data is processed by, for example, an external device of the reception device 200, or a processor included in the reception device 200.

Figure 2:
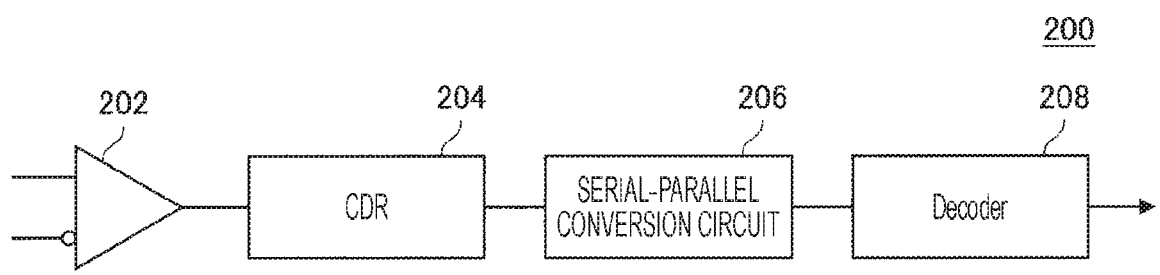
FIG. 2 is a block diagram illustrating a configuration example of a reception device according to the present embodiment.

FIG. 2 is a block diagram illustrating the configuration example of the reception device 200 according to the present embodiment. The reception device 200 includes, for example, a receiver circuit 202, a CDR circuit 204, a serial-parallel conversion circuit 206, and a decoder 208. In FIG. 2, the CDR circuit 204 is indicated as "CDR" and the decoder 208 is indicated as "Decoder".

The reception device 200 is driven by, for example, power supplied from an internal power supply (not illustrated) such as a battery included in the reception device 200, power supplied from an external power supply connected to the reception device 200, or the like.

The receiver circuit 202 converts a current flowing through the differential signal line into a voltage signal. The converted voltage signal is a signal corresponding to data in which the clock signal is embedded.

An example of the receiver circuit 202 is a current-voltage conversion circuit using an operational amplifier.

The CDR circuit 204 generates, from the voltage signal, a clock signal synchronized with the data (hereinafter referred to as "synchronized clock signal"). The CDR circuit 204 extracts a clock signal from the voltage signal and generates a synchronized clock signal synchronized with the extracted clock signal. An example of the CDR circuit 204 is a circuit using a phase locked loop (PLL).

The serial-parallel conversion circuit 206 converts received serial data into parallel data and performs demultiplexing.

The decoder 208 decodes signals demultiplexed by the serial-parallel conversion circuit 206.

The reception device 200 has, for example, a configuration illustrated in FIG. 2, thereby receiving the data transmitted from the transmission device 100.

Note that, the configuration of the reception device 200 according to the present embodiment is not limited to the example illustrated in FIG. 2.

For example, "the serial-parallel conversion circuit 206 and the decoder 208 illustrated in FIG. 2" or "the decoder 208 illustrated in FIG. 2" may be a circuit outside the reception device 200.

Furthermore, FIG. 2 illustrates the configuration example of the reception device 200 corresponding to the case where the transmission path T is the differential signal line; however, the reception device 200 can have a configuration corresponding to the transmission path T.

[1-2] Transmission Device 100

The transmission device 100 according to the present embodiment is a device that transmits a signal of an embedded clock method capable of performing switching between a first operation mode corresponding to a data transmission period and a second operation mode corresponding to a data transmission pause period. The first operation mode corresponds to the high speed mode described above, and the second operation mode corresponds to the low power mode described above. Hereinafter, the first operation mode is referred to as the high speed mode, and the second operation mode is referred to as the low power mode.

Examples of the data transmission pause period according to the present embodiment include an arbitrary period during which transmission is not performed of data to be transmitted during the data transmission period, such as a blanking period of image data.

Before describing the configuration example of the transmission device 100, a configuration example will be described of a transmission device capable of performing switching between the high speed mode and the low power mode.

Figure 3:
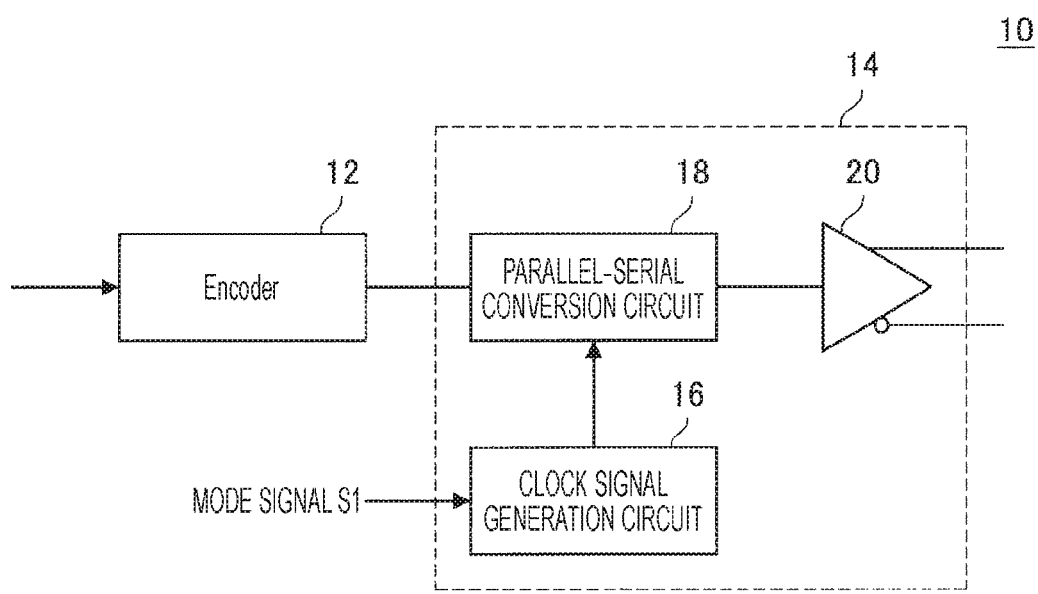
FIG. 3 is an explanatory diagram illustrating a configuration example of a transmission device capable of performing switching between a high speed mode and a low power mode.

[1-2-1] Configuration of Transmission Device Capable of Performing Switching Between High Speed Mode and Low Power Mode FIG. 3 is an explanatory diagram illustrating a configuration example of a transmission device 10 capable of performing switching between the high speed mode and the low power mode.

The transmission device 10 includes, for example, an encoder 12 and a transmission circuit 14, and transmits data in which a clock signal is embedded in input data. In FIG. 3, the encoder 12 is indicated as "Encoder".

Examples of data input to the transmission device 10 include arbitrary data, for example, image data generated by imaging in an imaging device, data read from a recording medium, and the like. Furthermore, in a case where an analog signal is input to the transmission device 10, the transmission device 10 may perform analog-digital conversion on the analog signal and transmit data in which the clock signal is embedded in the converted data.

The transmission device 10 is driven by, for example, power supplied from an internal power supply (not illustrated) such as a battery included in the transmission device 10, power supplied from an external power supply connected to the transmission device 10, or the like.

The encoder 12 encodes arbitrary data, for example, image data generated by imaging in an imaging device, data read from a recording medium, and the like. The encoder 12 encodes the data by an arbitrary encoding method, for example, an 8b10b encoding method, or the like.

Note that, in a case where an analog signal is input to the encoder 12, the encoder 12 may perform analog-digital conversion on the analog signal to perform encoding. Furthermore, the transmission device 10 does not have to include the encoder 12, and data encoded by an encoder outside the transmission device 10 may be input to the transmission device 10.

The transmission circuit 14 includes, for example, a clock signal generation circuit 16, a parallel-serial conversion circuit 18, and a driver 20, and transmits the data in which the clock signal is embedded. Furthermore, the transmission circuit 14 may include a frequency divider circuit that divides the clock signal output from the clock signal generation circuit 16.

The clock signal generation circuit 16 serves as a clock signal generation unit in the transmission device 10 and generates the clock signal. The clock signal generation circuit 16 generates a first clock signal corresponding to the high speed mode, or a second clock signal corresponding to the low power mode and having a lower frequency than the first clock signal. The clock signal generation circuit 16 generates the first clock signal during the data transmission period, and generates the second clock signal during the data transmission pause period. For example, in a case where the data transmission speed in the transmission device 10 is 5 [Gbps], an example of the first clock signal generated by the clock signal generation circuit 16 is a clock signal having a frequency of 2.5 [GHz].

The clock signal generation circuit 16 includes, for example, a first clock signal generation circuit (not illustrated), and a second clock signal generation circuit (not illustrated) that serves to generate the second clock signal.

The first clock signal generation circuit (not illustrated) serves to generate the first clock signal. An example of the first clock signal generation circuit (not illustrated) is a circuit using a PLL.

The second clock signal generation circuit (not illustrated) serves to selectively generate the second clock signal. Here, the selective generation of the second clock signal means, for example, that the second clock signal generation circuit (not illustrated) generates the second clock signal during the data transmission pause period, and does not generate the second clock signal during the data transmission period.

In a case where the second clock signal is generated, the second clock signal generation circuit (not illustrated) outputs the generated second clock signal. Furthermore, in a case where the second clock signal is not generated, the second clock signal generation circuit (not illustrated) outputs the first clock signal generated in the first clock signal generation circuit (not illustrated).

The second clock signal generation circuit (not illustrated) selectively generates the second clock signal on the basis of the first clock signal generated in the first clock signal generation circuit (not illustrated) and a mode signal S1.

The mode signal S1 according to the present embodiment is a signal indicating the first operation mode (high speed mode) or the second operation mode (low power mode), and indicates each operation mode depending on whether the signal is a high level signal or a low level signal. Hereinafter, an example case will be described where the low level mode signal S1 indicates the high speed mode and the high level mode signal S1 indicates the low power mode. Note that, the high level mode signal S1 may indicate the high speed mode, and the low level mode signal S1 may indicate the low power mode. The mode signal S1 is generated by, for example, a processor (not illustrated) included in a transmission device (for example, the transmission device 100, the transmission device 10), or an external device.

For example, the second clock signal generation circuit (not illustrated) generates the second clock signal by shaping the waveform of the first clock signal. More specifically, the second clock signal generation circuit (not illustrated) shapes the waveform of the first clock signal by, for example, deleting the high level pulse of the first clock signal and embedding the low level pulse of the first clock signal, to generate the second clock signal.

The second clock signal generation circuit (not illustrated) that outputs the first clock signal or the second clock signal in which the waveform of the first clock signal is shaped is implemented by a logic circuit, for example.

Note that, the second clock signal generation circuit (not illustrated) is not limited to the example described above. For example, the second clock signal generation circuit (not illustrated) may have "a configuration in which the second clock signal is generated from the first clock signal by the frequency divider circuit, and switching is performed by a selector, and the first clock signal or the second clock signal is output".

The parallel-serial conversion circuit 18 operates on the basis of the clock signal (the first clock signal or the second clock signal) output from the clock signal generation circuit 16, and converts parallel data output from the encoder 12 into serial data in which the clock signal is embedded. The parallel-serial conversion circuit 18 includes, for example, a multiplexer, a D-type flip-flop, and a selector.

The driver 20 transmits the serial data in which the clock signal is embedded by current drive of the differential signal line.

The transmission device 10 has a configuration illustrated in FIG. 3, for example.

Here, for example, the clock signal generation circuit 16 generates the first clock signal in the high speed mode corresponding to the data transmission period, and generates the second clock signal in the low power mode corresponding to the data transmission pause period. That is, in the low power mode corresponding to the data transmission pause period, the transmission circuit 14 operates with the second clock signal (low speed clock) having a lower frequency than the first clock signal (high speed clock) for data transmission. Thus, the power consumption of the transmission device 10 during operation in the low power mode corresponding to the data transmission pause period is reduced from the power consumption of the transmission device 10 during operation in the high speed mode corresponding to the data transmission period.

Furthermore, the transmission circuit 14 transmits the data in which the clock signal is embedded.

Thus, the transmission device 10 illustrated in FIG. 3 can transmit the data in which the clock signal is embedded while achieving low power consumption.

However, when switching is performed between the high speed mode and the low power mode in the transmission device 10 illustrated in FIG. 3, current consumption in the transmission device 10 changes and a power supply voltage of the transmission device 10 fluctuates, and as a result, there is a possibility that a large jitter occurs in the signal transmitted by the transmission device 10.

FIGS. 4A and 4B are explanatory diagrams illustrating an operation example when switching of the operation mode is performed in the transmission device 10 illustrated in FIG. 3. FIGS. 4A and 4B illustrate an example of the mode signal S1, a transmission circuit current (for example, current consumption in the transmission circuit 14) in each operation mode, the power supply voltage supplied from the power supply in each operation mode, and a jitter trend. Note that, the various numerical values illustrated in FIGS. 4A and 4B are examples.

As illustrated in FIG. 4A, when switching is performed from the high speed mode to the low power mode, the transmission circuit current decreases, and as a result, a large jitter occurs in the transmission signal. Furthermore, as illustrated in FIG. 4B, when switching is performed from the low power mode to the high speed mode, the transmission circuit current increases, and as a result, a large jitter occurs in the transmission signal.

Thus, in a case where the transmission device 10 illustrated in FIG. 3 is used as the transmission device constituting the communication system, the CDR cannot follow in the reception device, and there is a possibility that an error occurs.

[1-2-2] Outline of Transmission Device 100

Thus, the transmission device 100 according to the present embodiment further includes a power supply noise reduction circuit in addition to the configuration of the transmission device 10 illustrated in FIG. 3, thereby moderating power supply fluctuations when switching of the operation mode is performed, to moderate jitter fluctuations.

Since the transmission device 100 basically has a configuration (including modifications) similar to that of the transmission device 10 illustrated in FIG. 3, the transmission device 100 can transmit the data in which the clock signal is embedded while achieving low power consumption. Furthermore, the transmission device 100 moderates the power supply fluctuations when switching of the operation mode is performed, to moderate the jitter fluctuations, so that the reception device 200 that receives the signal transmitted by the transmission device 100 can maintain CDR synchronization.

Thus, with the transmission device 100, the communication systems 1000 is implemented capable of achieving low power consumption of the transmission device 100 while maintaining the CDR synchronization in the reception device 200.

[1-2-3] Configuration of Transmission Device 100

FIG. 5 is an explanatory diagram illustrating a configuration example of the transmission device 100 according to the present embodiment. Furthermore, FIG. 6 is an explanatory diagram illustrating another example of the configuration of the transmission device 100 according to the present embodiment.

The transmission device 100 includes, for example, an encoder 102, a transmission circuit 104, and a power supply noise reduction circuit 106. In FIG. 5, the encoder 102 is indicated as "Encoder".

Furthermore, the transmission device 100 may include a processor (not illustrated) that controls the entire transmission device 100, for example. In the transmission device 100, for example, by a processor (not illustrated) included in the transmission device 100, or an external device (for example, a device having a function similar to that of the processor (not illustrated)), operation in each period (data transmission period, data transmission pause period) is controlled. More specifically, the operation of the transmission device 100 in each period (data transmission period, data transmission pause period) is controlled by, for example, "the mode signal S1", or "the mode signal S1 and a mode switching notice signal S2 (described later)" transferred from the processor (not illustrated) included in the transmission device 100, or the like.

The transmission device 100 is driven by, for example, power supplied from an internal power supply (not illustrated) such as a battery included in the transmission device 100, or power supplied from an external power supply connected to the transmission device 100. Hereinafter, power supplies that supply power to the constituents of the transmission device 100, such as the internal power supply included in the transmission device 100 and the external power supply connected to the transmission device 100, may be collectively referred to as the "power supply".

The difference between the transmission device 100 illustrated in FIG. 5 and the transmission device 100 illustrated in FIG. 6 is a signal input to the power supply noise reduction circuit 106. More specifically, the mode signal S1 is input to the power supply noise reduction circuit 106 illustrated in FIG. 5, whereas the mode signal S1 and the mode switching notice signal S2 are input to the power supply noise reduction circuit 106 illustrated in FIG. 5. Note that, the transmission device 100 can have a configuration in which only the mode switching notice signal S2 is input to the power supply noise reduction circuit 106.

Here, the mode switching notice signal S2 according to the present embodiment is a signal that notifies that switching is to be performed between the first operation mode (high speed mode) and the second operation mode (low power mode). Examples of the mode switching notice signal S2 include an arbitrary format signal that can specify which mode the power supply noise reduction circuit 106 switches to.

The mode switching notice signal S2 is generated by the processor (not illustrated) included in the transmission device 100 or the external device, for example, similarly to the mode signal S1. The processor (not illustrated) included in the transmission device 100, or the like that generates the mode signal S1 and the mode switching notice signal S2 outputs the mode switching notice signal S2 corresponding to a mode to be changed before outputting the mode signal S1 of a signal level corresponding to the mode to be changed.

[1-2-3-1] Encoder 102 and Transmission Circuit 104

The encoder 102 has a function and a configuration similar to those of the encoder 12 illustrated in FIG. 3, and encodes arbitrary data, such as image data generated by imaging in an imaging device and data read from a recording medium. Note that, in a case where an analog signal is input to the encoder 102, the encoder 102 may perform analog-digital conversion on the analog signal to perform encoding. Furthermore, the transmission device 100 does not have to include the encoder 102, and data encoded by an encoder outside the transmission device 100 may be input to the transmission device 100.

The transmission circuit 104 operates on the basis of a clock signal (the first clock signal or the second clock signal) transferred from a clock signal generation circuit 108, for example, similarly to the transmission circuit 14 illustrated in FIG. 3, and transmits data in which the clock signal is embedded. The transmission circuit 104 includes the clock signal generation circuit 108, a parallel-serial conversion circuit 110, and a driver 112, for example, respectively having functions and configurations similar to those of the clock signal generation circuit 16, the parallel-serial conversion circuit 18, and the driver 20 illustrated in FIG. 3.

By including the encoder 102 and the transmission circuit 104, the transmission device 100 can transmit the data in which the clock signal is embedded, similarly to the transmission device 10 illustrated in FIG. 3.

Note that, the configuration of the transmission circuit 104 is not limited to the configuration illustrated in FIGS. 5 and 6. For example, the transmission circuit 104 can have an arbitrary configuration capable of performing switching between the first operation mode (high speed mode) and the second operation mode (low power mode) on the basis of the mode signal S1, and transmitting the data in which the clock signal is embedded.

[1-2-3-2] Power Supply Noise Reduction Circuit 106

The power supply noise reduction circuit 106 reduces noise of the power supply that supplies power to the transmission circuit 104 when switching is performed between the high speed mode and the low power mode.

The power supply noise reduction circuit 106 reduces the noise of the power supply at a time point (hereinafter referred to as "mode switching time point") when switching is performed between the high speed mode and the low power mode, or reduces the noise of the power supply after the mode switching time point. The power supply noise reduction circuit 106 reduces the noise of the power supply at the mode switching time point by, for example, gradually increasing or gradually decreasing an additional current discharged from the power supply or caused to flow into the power supply before the mode switching time point. Furthermore, the power supply noise reduction circuit 106 reduces the noise of the power supply after the mode switching time point by, for example, gradually increasing or gradually decreasing the additional current after the mode switching time point. A period in which the additional current is discharged from the power supply in the power supply noise reduction circuit 106, and a period in which the additional current is caused to flow into the power supply are each set to, for example, a period corresponding to about a frequency at which the CDR follows.

Reduction of the noise of the power supply after the mode switching time point is implemented by the power supply noise reduction circuit 106 operating on the basis of the mode signal S1. That is, the power supply noise reduction circuit 106 reduces the noise of the power supply after the mode switching time point on the basis of the mode signal S1.

Furthermore, reduction of the noise of the power supply at the mode switching time point is implemented by the power supply noise reduction circuit 106 operating on the basis of the mode signal S1 and the mode switching notice signal S2. The power supply noise reduction circuit 106 starts operation for reducing the noise of the power supply before the mode switching time point on the basis of the mode switching notice signal S2. Furthermore, the power supply noise reduction circuit 106 ends the operation for reducing the noise of the power supply on the basis of the mode signal S1. That is, the power supply noise reduction circuit 106 reduces the noise of the power supply at the mode switching time point on the basis of the mode signal S1 and the mode switching notice signal S2.

Note that, for example, in a case where a time interval from when the mode switching notice signal S2 is acquired to when switching of the mode is performed is set, the power supply noise reduction circuit 106 can end the operation for reducing the noise of the power supply on the basis of the set time interval. That is, the power supply noise reduction circuit 106 may have a configuration in which the noise of the power supply at the mode switching time point is reduced on the basis of only the mode switching notice signal S2.

More specifically, the power supply noise reduction circuit 106 operates on the basis of the mode signal S1 and the mode switching notice signal S2, whereby the transmission device 100 can reduce the noise of the power supply by both the reduction of the noise of the power supply at the mode switching time point and the reduction of the noise of the power supply after the mode switching time point.

Here, the method of reducing the noise of the power supply is different between the operation mode switching from the high speed mode to the low power mode and the operation mode switching from the low power mode to the high speed mode.

Furthermore, the method of reducing the noise of the power supply after the mode switching time point is different from the method of reducing noise of the power supply at the mode switching time point.

Hereinafter, an operation example of the transmission device 100 when switching of the operation mode is performed, and a configuration example of the power supply noise reduction circuit 106 will be described.

First, the operation example will be described of the transmission device 100 when switching of the operation mode is performed.

(A) First Example of Operation of Transmission Device 100 when Switching of Operation Mode is Performed FIGS. 7A and 7B are explanatory diagrams illustrating a first example of the operation of the transmission device 100 when switching of the operation mode is performed, and illustrates an operation example in a case where reduction of the noise of the power supply is achieved after the mode switching time point in the transmission device 100 illustrated in FIG. 5. FIGS. 7A and 7B illustrate an example of the mode signal S1, the transmission circuit current (for example, current consumption in the transmission circuit 104) in each operation mode, the additional current supplied by the power supply noise reduction circuit 106, the power supply voltage supplied from the power supply in each operation mode, and the jitter trend. Note that, the various numerical values illustrated in FIGS. 7A and 7B are examples.

As illustrated in FIG. 7A, since the transmission circuit current decreases when the mode is switched from the high speed mode to the low power mode, the power supply noise reduction circuit 106 discharges the additional current that gradually decreases from the power supply. Furthermore, as illustrated in FIG. 7B, since the transmission circuit current increases when the mode is switched from the low power mode to the high speed mode, the power supply noise reduction circuit 106 causes the additional current that gradually decreases to flow into the power supply.

For example, the power supply noise reduction circuit 106 operates as described above, whereby the fluctuation of the power supply voltage when switching of the operation mode is performed becomes moderate, and the jitter fluctuation also becomes moderate, as illustrated in FIGS. 7A and 7B. Furthermore, from FIGS. 7A and 7B, it can be seen that the method of reducing the noise of the power supply is different between the operation mode switching from the high speed mode to the low power mode and the operation mode switching from the low power mode to the high speed mode.

(B) Second Example of Operation of Transmission Device 100 when Switching of Operation Mode is Performed FIGS. 8A and 8B are explanatory diagrams illustrating a second example of the operation of the transmission device 100 when switching of the operation mode is performed, and illustrates an operation example in a case where reduction of the noise of the power supply at the mode switching time point is achieved in the transmission device 100 illustrated in FIG. 6. Similarly to FIGS. 7A and 7B, FIGS. 8A and 8B illustrate an example of the mode signal S1, the transmission circuit current in each operation mode, the additional current supplied by the power supply noise reduction circuit 106, the power supply voltage supplied from the power supply in each operation mode, and the jitter trend. Note that, the various numerical values illustrated in FIGS. 8A and 8B are examples.

As described above, the power supply noise reduction circuit 106 starts the operation for reducing the noise of the power supply before the mode switching time point on the basis of the mode switching notice signal S2, and achieves reduction of the noise of the power supply at the mode switching time point. Furthermore, the power supply noise reduction circuit 106 ends the operation for reducing the noise of the power supply on the basis of the mode signal S1 or on the basis of the set time interval, for example.

As described with reference to FIGS. 7A and 7B, the transmission circuit current decreases when the mode is switched from the high speed mode to the low power mode. Thus, as illustrated in FIG. 8A, the power supply noise reduction circuit 106 causes the additional current that gradually increases to flow into the power supply, and cuts off the additional current at the mode switching time point.

Furthermore, as described with reference to FIGS. 7A and 7B, the transmission circuit current increases when the mode is switched from the low power mode to the high speed mode. Thus, as illustrated in FIG. 8B, the power supply noise reduction circuit 106 discharges the additional current that gradually increases from the power supply, and cuts off the additional current at the mode switching time point.

For example, the power supply noise reduction circuit 106 operates as described above, whereby the fluctuation of the power supply voltage when switching of the operation mode is performed becomes moderate, and the jitter fluctuation also becomes moderate, as illustrated in FIGS. 8A and 8B. Furthermore, from FIGS. 8A and 8B, it can be seen that the method of reducing the noise of the power supply is different between the operation mode switching from the high speed mode to the low power mode and the operation mode switching from the low power mode to the high speed mode.

(C) Another Example of Operation of Transmission Device 100 When Switching of Operation Mode is Performed The operation example of the transmission device 100 when switching of the operation mode is performed is not limited to the first example described in (A) and the second example described in (B).

For example, the transmission device 100 can reduce the noise of the power supply by operation in which FIGS. 7A and 8B are combined or operation in which FIGS. 8A and 7B are combined. The above-described combination operation of the first example described in (A) and the second example described in (B) is implemented by, for example, the power supply noise reduction circuit 106 operating on the basis of the mode signal S1 and the mode switching notice signal S2.

Even in a case where the above-described combination operation of the first example described in (A) and the second example described in (B) is performed, similarly to the first example described in (A) and the second example described in (B), the fluctuation of the power supply voltage when switching of the operation mode is performed becomes moderate, and the jitter fluctuation also becomes moderate.

Next, a configuration example will be described of the power supply noise reduction circuit 106.

Figure 9:
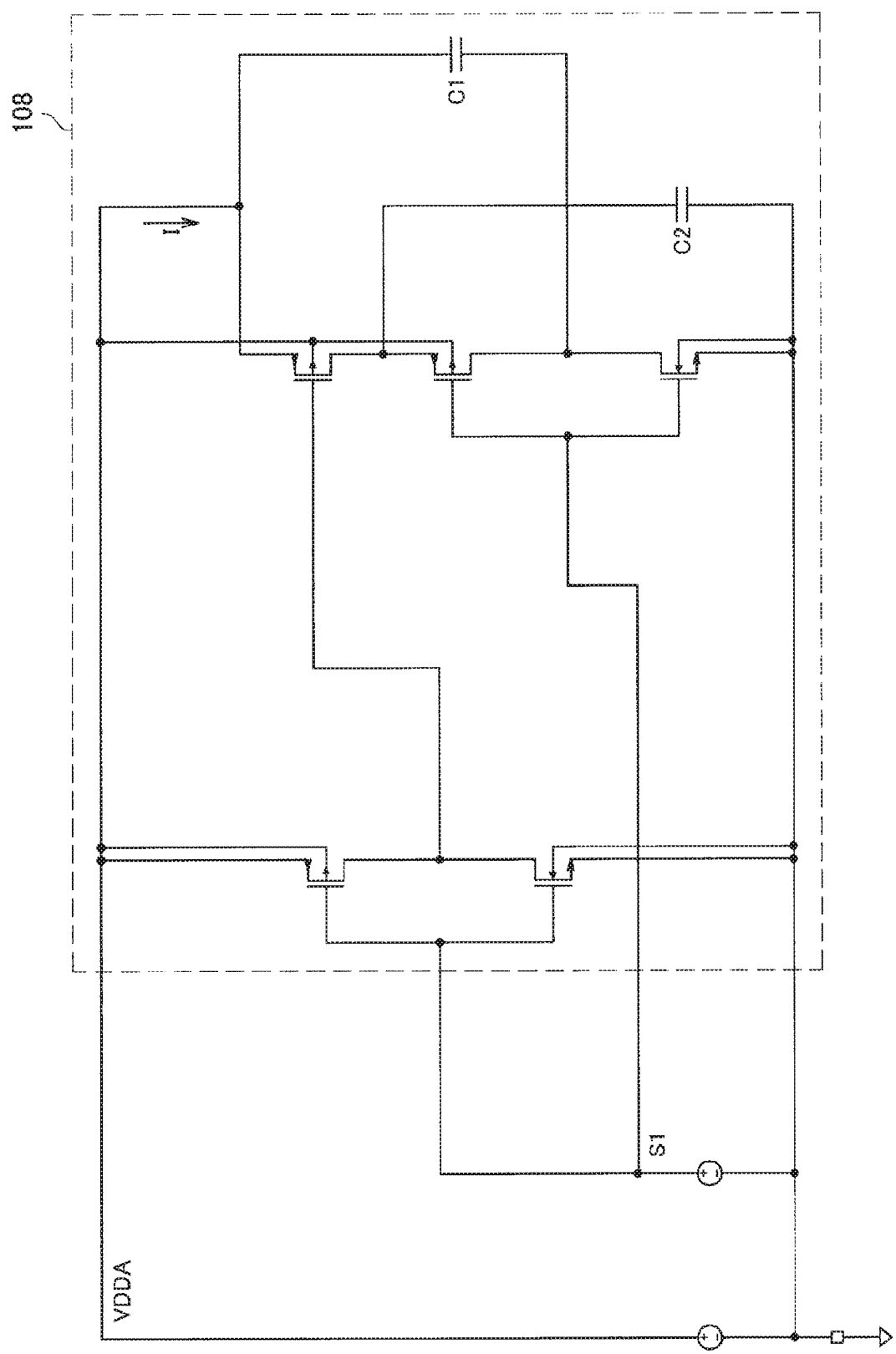
FIG. 9 is an explanatory diagram illustrating a first example of a configuration of a power supply noise reduction circuit included in the transmission device according to the present embodiment.

FIG. 9 is an explanatory diagram illustrating a first example of the configuration of the power supply noise reduction circuit 106 included in the transmission device 100 according to the present embodiment, and illustrates a configuration example of the power supply noise reduction circuit 106 capable of implementing operations illustrated in FIGS. 7A and 7B.

Figure 10A:
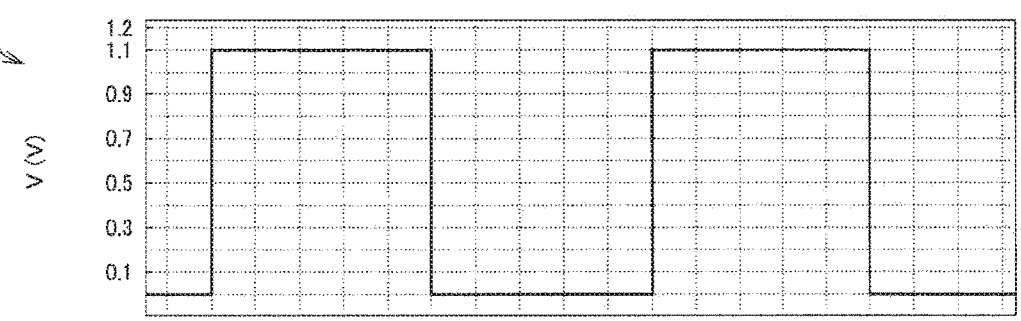
FIGS. 10A and 10B are explanatory diagrams for explaining operation of the power supply noise reduction circuit illustrated in FIG. 9.
Figure 10B:
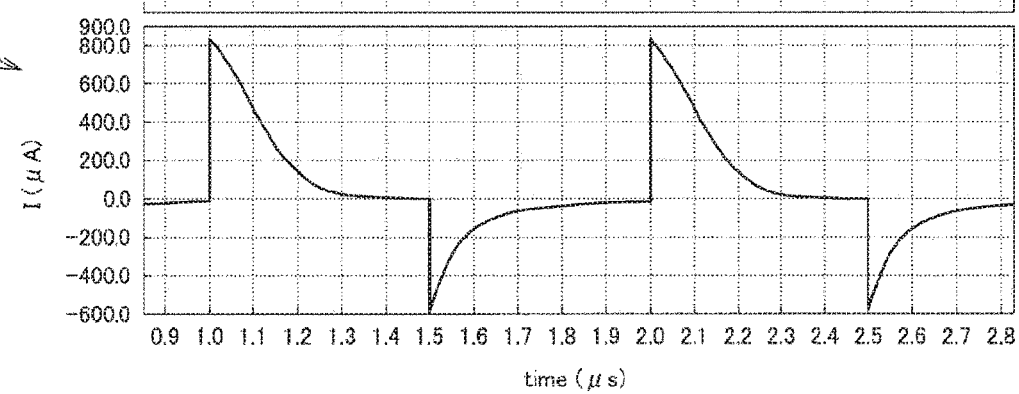

Furthermore, FIGS. 10A and 10B are explanatory diagrams for explaining operation of the power supply noise reduction circuit 106 illustrated in FIG. 9. FIG. 10A illustrates an example of the mode signal S1, and FIG. 10B illustrates an example of a current I (that corresponds to the additional current. The same shall apply hereinafter.) illustrated in FIG. 9.

As illustrated in FIG. 9, the power supply noise reduction circuit 106 includes a plurality of capacitive elements C1 and C2. Examples of the capacitive elements C1 and C2 include capacitors. Furthermore, the capacitive elements C1 and C2 may be parasitic capacitances. Note that, in FIG. 9, two capacitive elements C1 and C2 are illustrated as the plurality of capacitive elements; however, the power supply noise reduction circuit 106 may include three or more capacitive elements.

Furthermore, the power supply noise reduction circuit 106 illustrated in FIG. 9 includes a plurality of switching transistors, and each of the switching transistors becomes the on state (conductive state) or the off state (non-conductive state) on the basis of the mode signal S1. Examples of the switching transistors constituting the power supply noise reduction circuit 106 include field-effect transistors (FETs) such as metal-oxide-semiconductor field effect transistors (MOSFETs) and thin film transistors (TFTs), bipolar transistors, and the like. Furthermore, the polarities of the switching transistors constituting the power supply noise reduction circuit 106 are not limited to the examples illustrated in the present specification such as FIG. 9, and can vary depending on signals applied to the control terminals of the transistors.

In the power supply noise reduction circuit 106 illustrated in FIG. 9, on the basis of the mode signal S1, switching is performed between that the plurality of capacitive elements C1 and C2 is connected together in series and that the plurality of capacitive elements C1 and C2 is connected together in parallel. More specifically, the power supply noise reduction circuit 106 causes the additional current that gradually decreases to flow into the power supply by connecting the plurality of capacitive elements C1 and C2 together in series. Furthermore, the power supply noise reduction circuit 106 discharges the additional current that gradually decreases from the power supply by connecting the plurality of capacitive elements C1 and C2 together in parallel. The power supply noise reduction circuit 106 illustrated in FIG. 9 reduces the noise of the power supply by charging and discharging the charge of the capacitance.

For example, the power supply noise reduction circuit 106 having the configuration illustrated in FIG. 9 is included, whereby the operations illustrated in FIGS. 7A and 7B are implemented in the transmission device 100.

Note that, the configuration of the power supply noise reduction circuit 106 for implementing the operations illustrated in FIGS. 7A and 7B is not limited to the example illustrated in FIG. 9. For example, the power supply noise reduction circuit 106 can also implement the operations illustrated in FIGS. 7A and 7B by performing switching between a differentiating circuit and an integrating circuit as described in a second example described later.

Figure 11:
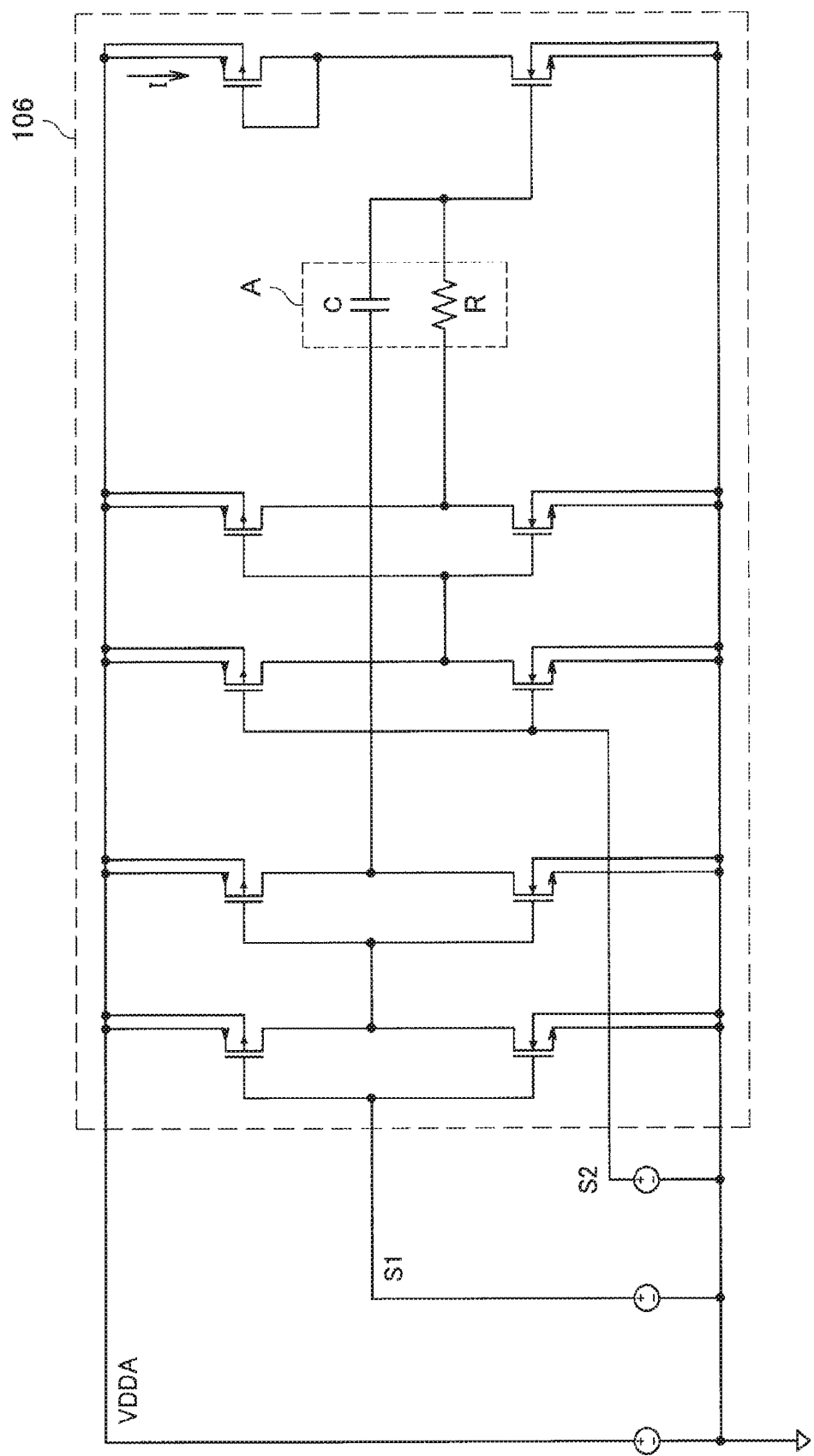
FIG. 11 is an explanatory diagram illustrating a second example of the configuration of the power supply noise reduction circuit included in the transmission device according to the present embodiment.

FIG. 11 is an explanatory diagram illustrating the second example of the configuration of the power supply noise reduction circuit 106 included in the transmission device 100 according to the present embodiment, and illustrates a configuration example of the power supply noise reduction circuit 106 capable of implementing operations illustrated in FIGS. 7A and 8B.

Figure 12:
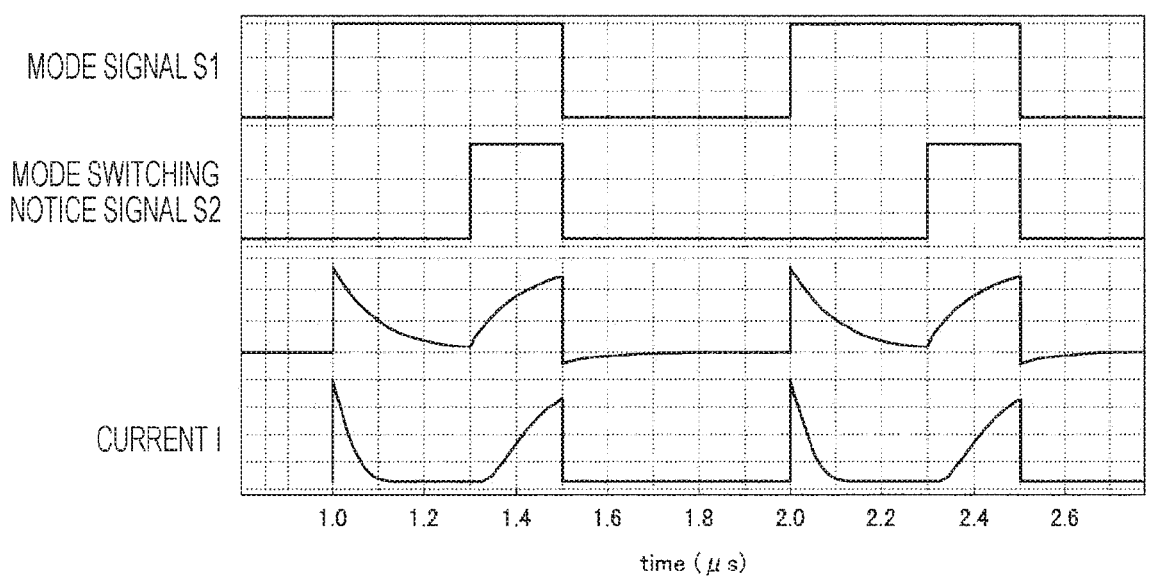
FIG. 12 is an explanatory diagram for explaining operation of the power supply noise reduction circuit illustrated in FIG. 11.

Furthermore, FIG. 12 is an explanatory diagram for explaining operation of the power supply noise reduction circuit 106 illustrated in FIG. 11.

As illustrated in FIG. 11, the power supply noise reduction circuit 106 includes a capacitive element C and a resistive element W. Furthermore, the power supply noise reduction circuit 106 illustrated in FIG. 11 includes a plurality of switching transistors. An example of the capacitive element C is a capacitor. Furthermore, the capacitive element C may be a parasitic capacitance. An example of the resistive element is a resistor.

In the power supply noise reduction circuit 106 illustrated in FIG. 11, on the basis of the mode signal S1 and the mode switching notice signal S2, switching is performed between configuring the differentiating circuit with the capacitive element C and the resistive element R illustrated in A of FIG. 11 and configuring the integrating circuit with the capacitive element C and the resistive element R illustrated in A of FIG. 11. More specifically, the power supply noise reduction circuit 106 configures the differentiating circuit with the capacitive element C and the resistive element R, thereby discharging the additional current that gradually decreases from the power supply. Furthermore, the power supply noise reduction circuit 106 configures the integrating circuit with the capacitive element C and the resistive element R, whereby the power supply noise reduction circuit 106 discharges the additional current that gradually increases from the power supply. The power supply noise reduction circuit 106 illustrated in FIG. 11 discharges the additional current from the power supply, for example, by turning on/off a switching transistor provided between the power supply and a reference potential point (for example, the ground).

For example, the power supply noise reduction circuit 106 having the configuration illustrated in FIG. 11 is included, whereby the operations illustrated in FIGS. 7A and 8B are implemented in the transmission device 100.

Note that, the configuration of the power supply noise reduction circuit 106 for implementing the operations illustrated in FIGS. 7A and 8B is not limited to the example illustrated in FIG. 11. For example, the power supply noise reduction circuit 106 can also implement the operations illustrated in FIGS. 7A and 8B by performing switching between connecting the plurality of capacitive elements together in series and connecting the plurality of capacitors together in parallel, as described in the first example above.

Note that, the configuration of the power supply noise reduction circuit 106 is not limited to the examples illustrated in FIGS. 9 and 11.

For example, the power supply noise reduction circuit 106 can also reduce the noise of the power supply in switching of the operation mode by using another power supply different from the power supply that supplies power to the transmission circuit 104.

FIG. 13 is an explanatory diagram illustrating another example of the configuration of the power supply noise reduction circuit 106 included in the transmission device according to the present embodiment, and illustrates another configuration example of the power supply noise reduction circuit 106 capable of implementing the operations illustrated in FIGS. 7A and 7B.

Figures 14A, 14B:
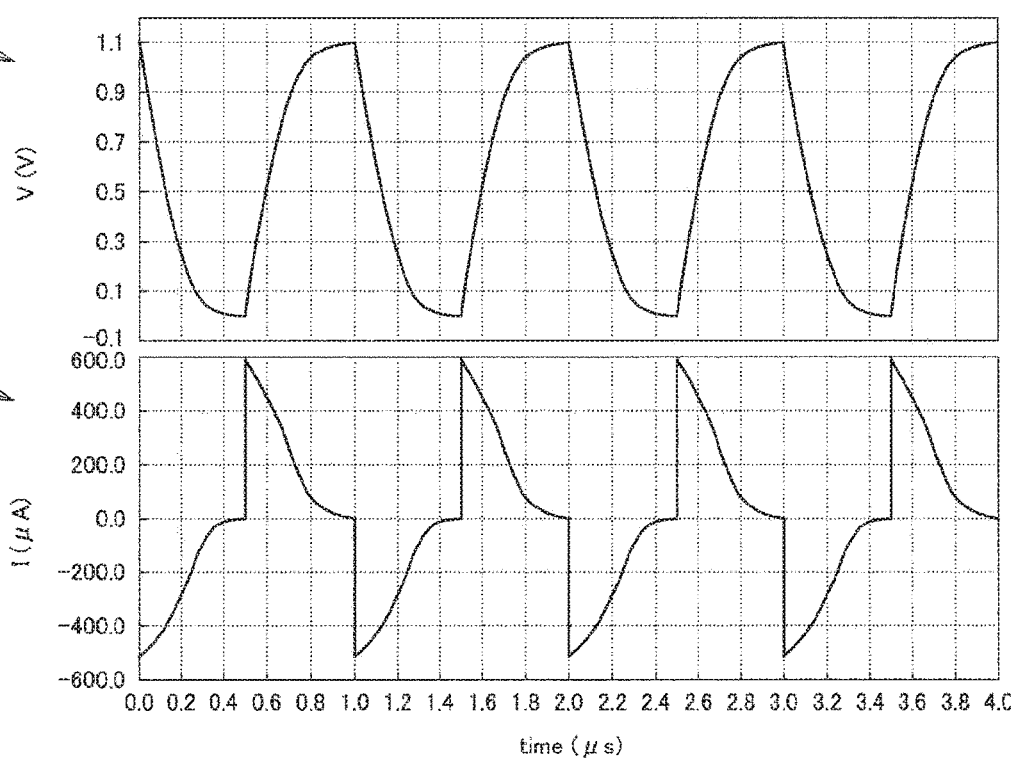
FIGS. 14A and 14B are explanatory diagrams for explaining operation of the power supply noise reduction circuit illustrated in FIG. 13.

Furthermore, FIGS. 14A and 14B are explanatory diagrams for explaining operation of the power supply noise reduction circuit 106 illustrated in FIG. 13. FIG. 14A illustrates an example of the mode signal S1, and FIG. 14B illustrates an example of a power supply current.

The power supply noise reduction circuit 106 illustrated in FIG. 13 includes switching elements and a capacitive element, and draws a current from another power supply with the capacitance, or discharges the current, on the basis of the mode signal S1.

Thus, for example, even in a case where the power supply noise reduction circuit 106 having the configuration illustrated in FIG. 13 is included, the operations illustrated in FIGS. 7A and 7B can be implemented in the transmission device 100.

The transmission device 100 has the configuration including the power supply noise reduction circuit 106 as illustrated in FIG. 5 or 6, for example.

Here, as described with reference to FIGS. 7A, 7B, 8A, and 8B, for example, the power supply noise reduction circuit 106 moderates the power supply fluctuations when switching of the operation mode is performed, to moderate the jitter fluctuations, so that the reception device 200 that receives the signal transmitted by the transmission device 100 can maintain CDR synchronization. Furthermore, since the transmission device 100 basically has the configuration (including modifications) similar to the transmission device 10 illustrated in FIG. 3, the transmission device 100 can transmit the data in which the clock signal is embedded while achieving low power consumption.

Thus, the transmission device 100 can achieve low power consumption of the transmission device 100 while maintaining CDR synchronization in the reception device 200.

[2] Effects Exhibited in Communication System According to the Present Embodiment In the communication system according to the present embodiment, for example, the following effects are exhibited. Note that, needless to say, the effects exhibited by the communication system according to the present embodiment are not limited to the following examples.

In a communication interface of the embedded clock method using CDR for reception synchronization, it is possible to reduce jitter when switching is performed from the high speed mode to the low power mode.

The above-described jitter is reduced, whereby it is possible to maintain the clock synchronization on the reception circuit side included in the reception device 200 even during the low power mode, so that high speed data transmission can be resumed immediately when switching is performed again from the low power mode to the high speed mode.

The high speed data transmission can be resumed immediately as described above, whereby frequent switching becomes possible from the high speed mode to the low power mode, and the power consumption can be reduced of the entire communication system.

The power consumption is reduced of the entire communication system, whereby data transfer efficiency (in other words, power efficiency) can be improved of the entire communication in the communication system.

[3] Application Example of Communication System According to the Present Embodiment In the above, as a constituent of the communication system according to the present embodiment, the transmission device has been described as an example; however, the present embodiment is not limited to such a form. The present embodiment can be applied to various image sensors, for example, "an image sensor used in an arbitrary mobile body such as a car, an electric car, a hybrid electric car, a motorcycle, a bicycle, a personal mobility, an airplane, a drone, a ship, a robot, an artificial satellite, or a probe", "an industrial image sensor used in a factory, a logistics system, and the like", "an image sensor used in intelligent transport systems (ITS)", "a security image sensor", and the like. Furthermore, the present embodiment can be applied to an arbitrary device (or system) having a transmission function, for example, "an arbitrary device including an image sensor, such as the above-described mobile body including an image sensor", "an imaging device such as a digital still camera or a digital video camera", "a computer such as a personal computer (PC) or a server", "a tablet type device", "a game machine", or the like.

Furthermore, as a constituent of the communication system according to the present embodiment, the reception device has been described as an example; however, the present embodiment is not limited to such a form. The present embodiment can be applied to an arbitrary device (or system) having a function of receiving a signal transmitted from the transmission device according to the present embodiment, for example, "a processor such as a digital signal processor (DSP)", "a display device", "a mobile assistance system for the mobile body, such as an advanced driving assistant system (ADAS)", or the like. The present embodiment can be applied to an arbitrary device (or system) to which the transmission device according to the present embodiment is applied.

Furthermore, as described above, the communication system according to the present embodiment is applied to a system in which arbitrary serial communication is performed of the embedded clock method using CDR for reception synchronization capable of performing wired or wireless communication, for example, PCI Express, USB 3.x, Display Port, MIPI M-PHY, VbyOne, SLVS-EC, and the like.

Hereinafter, the communication system will be described according to the present embodiment in which SLVS-EC is used, with an example case where the transmission device constituting the communication system according to the present embodiment is an image sensor, and the reception device constituting the communication system according to the present embodiment is a DSP.

[3-1] Configuration of Communication System in Which SLVS-EC is Used

Figure 15:
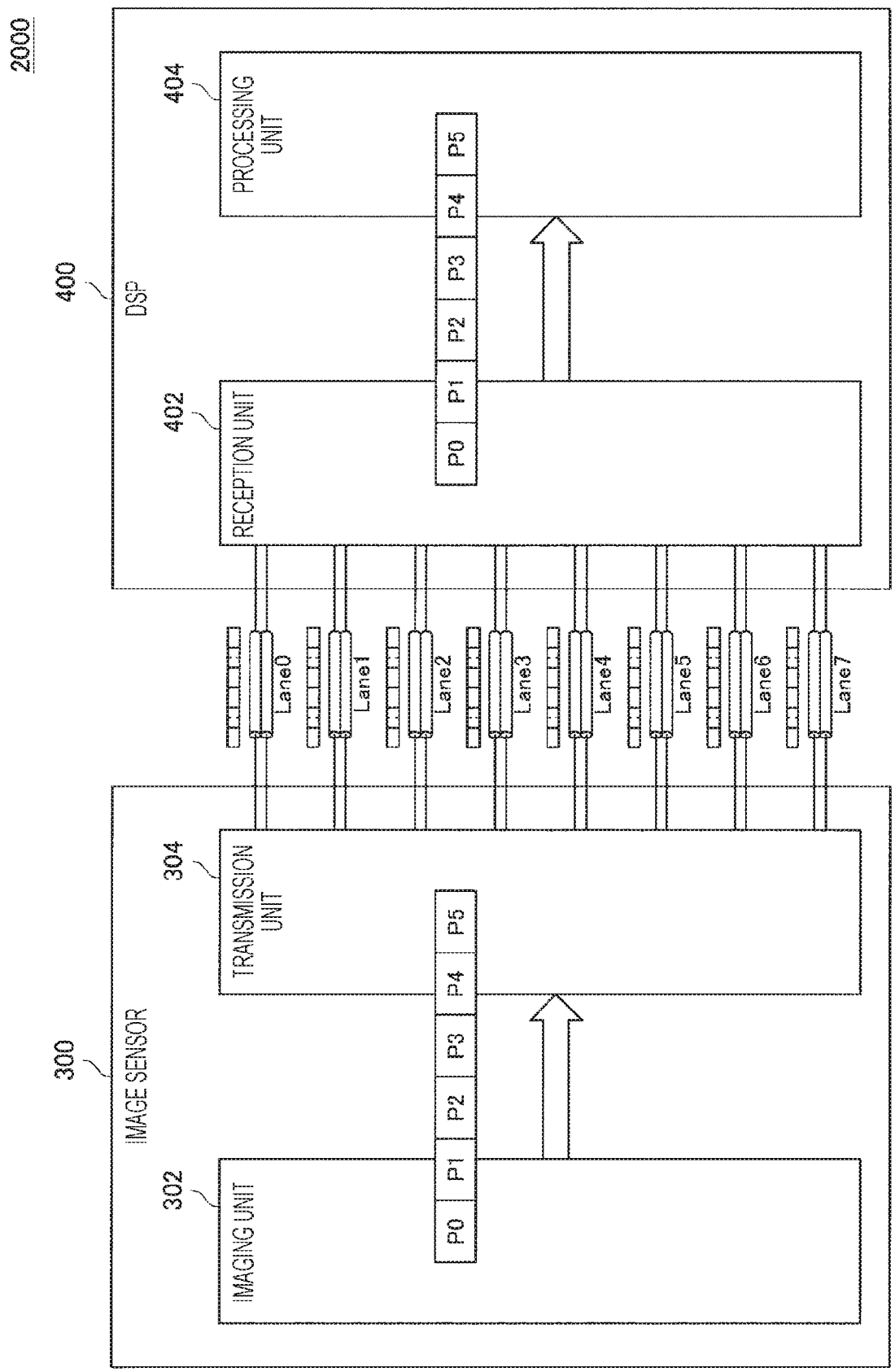
FIG. 15 is an explanatory diagram illustrating a configuration example of a communication system according to the present embodiment in which SLVS-EC is used.

FIG. 15 is an explanatory diagram illustrating a configuration example of a communication system 2000 according to the present embodiment in which SLVS-EC is used.

The communication system 2000 includes an image sensor 300 that functions as a transmission device according to the present embodiment, and a DSP 400 that functions as a reception device according to the present embodiment. The image sensor 300 and the DSP 400 respectively includes large scale integrated circuits (LSIs) different from each other, for example, and are provided in a device such as an imaging device. The image sensor 300 and the DSP 400 are driven by power supplied from an internal power supply (not illustrated) such as a battery included in the device, or power supplied from an external power supply connected to the device.

The image sensor 300 includes an imaging unit 302 and a transmission unit 304.

The imaging unit 302 includes, for example, a lens/imaging element and a signal processing circuit. The lens/imaging element includes, for example, a lens of an optical system, and an image sensor using a plurality of imaging elements such as a complementary metal oxide semiconductor (CMOS) image sensor, and a charge coupled device (CCD) image sensor. The signal processing circuit includes, for example, an automatic gain control (AGC) circuit and an analog to digital converter (ADC), and converts an analog signal generated by the imaging element into a digital signal (image data). Then, the signal processing circuit transfers pixel data constituting an image of one frame to the transmission unit 304 in order for each data of one pixel.

The transmission unit 304 assigns data of each pixel transferred from the imaging unit 302 to a plurality of transmission paths in the order of transfer from the imaging unit 302, for example, and transmits the data to the DSP 400 in parallel via the plurality of transmission paths. FIG. 15 illustrates an example in which image data is transmitted between the image sensor 300 and the DSP 400 using eight transmission paths. Hereinafter, the transmission path illustrated in FIG. 15 may be referred to as "Lane". As described above, the transmission logic T according to the present embodiment may be a wired transmission path or a wireless transmission path.

The transmission unit 304 includes, for example, the configuration of the transmission device 100 illustrated in FIG. 5 or 6. Furthermore, the transmission unit 304 includes a configuration corresponding to SLVS-EC (an example of the serial communication of the embedded clock method using CDR for reception synchronization), such as generation of a packet in a format described later.

The DSP 400 includes a reception unit 402 and a processing unit 404.

The reception unit 402 receives the pixel data transmitted from the image sensor 300 via the eight transmission paths, and transfers the data of each pixel to the processing unit 404 in order.

The reception unit 402 includes, for example, the configuration of the reception device 200 illustrated in FIG. 2.

The processing unit 404 generates an image of one frame on the basis of the pixel data transferred from the reception unit 402, and performs various types of processing on the generated image. Examples of the processing performed by the processing unit 404 include compression of image data, image display control, recording of image data on a recording medium, and the like.

In the communication system 2000, for example, image data is transmitted between the image sensor 300 and the DSP 400 configured as illustrated in FIG. 15.

[3-2] Format

Figures 16A, 16B:
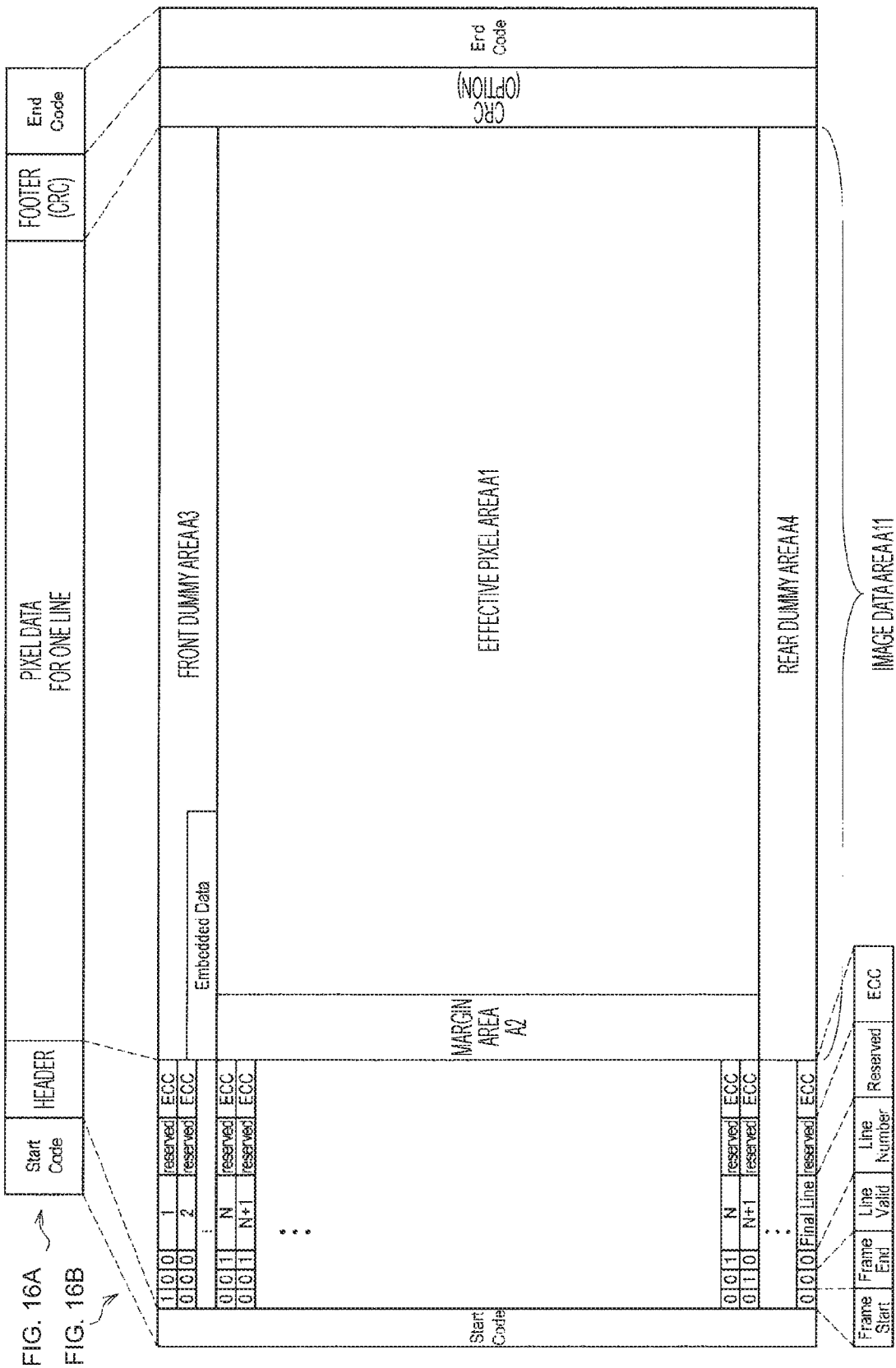
FIGS. 16A and 16B are explanatory diagrams illustrating an example of a format used for transmission of image data of one frame between an image sensor and a DSP illustrated in FIG. 15.

FIGS. 16A and 16B are explanatory diagrams illustrating an example of a format used for transmission of image data of one frame between the image sensor 300 and the DSP 400 illustrated in FIG. 15.

FIG. 16A illustrates a structure of a packet used for data transmission, and FIG. 16B illustrates an example of each data included in the packet.

As illustrated in FIG. 16A, the packet includes, for example, a header, a payload in which pixel data is stored, and a footer. The header and the footer are added to the payload in which the pixel data for one line is stored, whereby one packet is formed. Furthermore, Start Code and End Code that are control codes are added to the packet.

Figure 17:
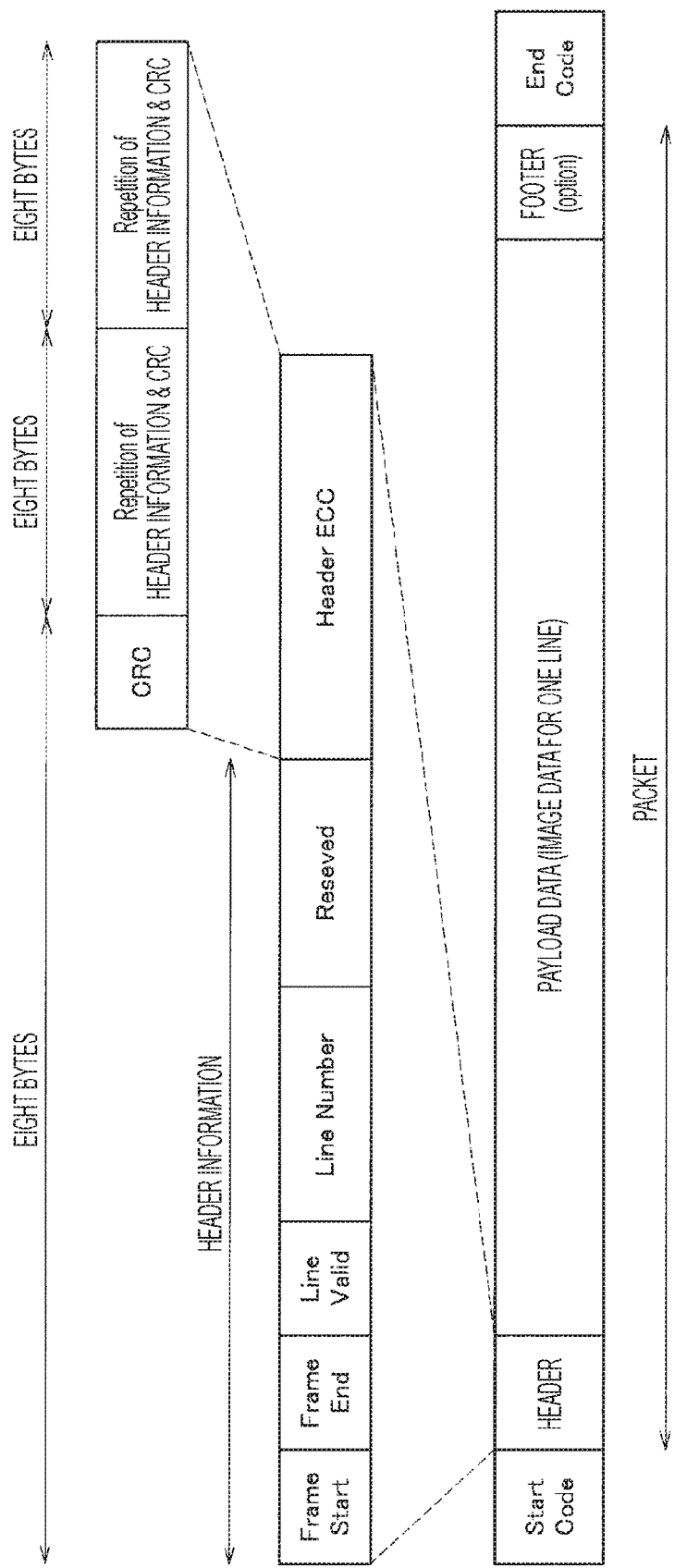
FIG. 17 is an explanatory diagram illustrating an example of a structure of a header.

FIG. 17 is an explanatory diagram illustrating an example of a structure of the header.

The header includes additional data of the pixel data stored in the payload, such as Frame Start, Frame End, Line Valid, Line Number, and Header Error Correction Code (ECC).

FIG. 18 is an explanatory diagram for explaining various data included in the header illustrated in FIG. 17.

Frame Start is data of 1 [bit] indicating the head of the frame. For example, a value of 1 is set in Frame Start of the header of a packet used for transmission of the pixel data of the first line in an image data area A11 illustrated in FIGS. 16A and 16B described later, and a value of 0 is set in Frame Start of the header of a packet used for transmission of the pixel data of other lines.

Frame End is data of 1 [bit] indicating the end of the frame. A value of 1 is set in Frame End of the header of a packet including the pixel data of the end line of an effective pixel area A1 illustrated in FIGS. 16A and 16B described later in the payload, and a value of 0 is set in Frame End of the header of a packet used for transmission of the pixel data of other lines.

Line Valid is data of 1 [bit] indicating whether or not the pixel data line stored in the payload is an effective pixel line. A value of 1 is set in Line Valid of the header of a packet used for transmission of the pixel data of a line in the effective pixel area A1 illustrated in FIGS. 16A and 16B described later, and a value of 0 is set in Line Valid of the header of a packet used for transmission of the pixel data of other lines.

Line Number is data representing the line number of a line including the pixel data stored in the payload. Line Number represents the line number in 13 [bit], for example.

Reserved is an area for expansion. An example of Reserved is an area of 32 [bit].

An example of the amount of data of header information constituting the header illustrated in FIG. 17 is 6 [byte]. Note that, needless to say, the amount of data of the header information constituting the header illustrated in FIG. 17 is not limited to 6 [byte].

Header ECC includes a cyclic redundancy check (CRC) code. For example, in a case where the amount of data of the header information constituting the header is 6 [byte], Header ECC includes a CRC code of 2 [byte] calculated on the basis of the header information. Furthermore, Header ECC includes two pieces of data (for example, data of 8 [byte]) that are the same as a set of the header information and the CRC code, subsequently to the CRC code.

That is, the header of one packet includes the same three sets of the header information and the CRC code.

For example, in a case where the set of the header information and the CRC code is data of 8 [byte], the amount of data of the entire header is 24 [byte] that is the sum of the amounts of data of the first set of the header information and the CRC code, the second set of the header information and the CRC code, and the third set of the header information and the CRC code.

FIG. 19 is an explanatory diagram illustrating an example of a bit arrangement constituting one set of the header information and the CRC code, and illustrates an example of the bit arrangement in a case where the one set of the header information and the CRC code is data of 8 [byte].

In a byte H7 that is the first 1 [byte] of the 8 [byte] constituting the header, in order from the first 1 [bit], each 1 [bit] of Frame Start, Frame End, and Line Valid, and the first to fifth 1 [bit] of 13 [bit] of Line Number are included.

In a byte H6 that is the second 1 [byte], the sixth to thirteenth 1 [bit] of 13 [bit] of Line Number are included.

A byte H5 that is the third 1 [byte] to a byte H2 that is the sixth 1 [byte] are Reserved.

In a byte H1 that is the seventh 1 [byte] and a byte H0 that is the eighth 1 [byte], each CRC code [bit] is included.

The header has the structure described with reference to FIGS. 17 to 19, for example. Note that, needless to say, the header is not limited to the example described with reference to FIGS. 17 to 19.

Referring to FIGS. 16A and 16B again, the format will be described used for transmission of image data of one frame.

When an arrangement of pixels in the horizontal direction is a line, the pixel data is stored in the payload of the packet. Transmission of the entire image data of one frame is performed by using a number of packets greater than or equal to the number of pixels in the vertical direction of the image data area A11 illustrated in FIG. 16B.

The effective pixel area A1 illustrated in FIG. 16B is an area of effective pixels of an image of one frame captured by the imaging unit 302. On the left side of the effective pixel area A1 in FIG. 16B, a margin area A2 is set in which the number of pixels in the vertical direction is the same as the number of pixels in the vertical direction of the effective pixel area A1.

In the upper side of the effective pixel area A1 in FIG. 16B, a front dummy area A3 is set in which the number of pixels in the horizontal direction is the same as the number of pixels in the horizontal direction of the entire effective pixel area A1 and margin area A2. In the example of FIGS. 16A and 16B, Embedded Data is inserted in the front dummy area A3. Embedded Data includes, for example, data of setting values relating to imaging by the imaging unit 302, such as a shutter speed, an aperture value, and a gain.

In the lower side of the effective pixel area A1 in FIG. 16B, a rear dummy area A4 is set in which the number of pixels in the horizontal direction is the same as the number of pixels in the horizontal direction of the entire effective pixel area A1 and margin area A2. Embedded Data described above may be inserted not in the front dummy area A3 but in the rear dummy area A4.

The image data area A11 includes, for example, the effective pixel area A1, the margin area A2, the front dummy area A3, and the rear dummy area A4.

A header is added in front of each line constituting the image data area A11, and Start code is added in front of the header.

Furthermore, a footer is optionally added after each line constituting the image data area A11, and a control code such as End Code is added after the footer. In a case where no footer is added, the control code such as End Code is added after each line constituting the image data area A11.

Each time the image sensor 300 transmits the image of one frame captured by the imaging unit 302, the image sensor 300 transmits data in the format illustrated in FIGS. 16A and 16B, for example. The format illustrated in FIGS. 16A and 16B are adopted, whereby it becomes possible to transmit additional data such as a header, and control codes such as Start Code and End Code during a blanking period for each line.

Note that, needless to say, the example of the format used for transmission of image data of one frame between the image sensor 300 and the DSP 400 illustrated in FIG. 15 is not limited to the example illustrated in FIGS. 16A and 16B.

[3-3] Example of Data Transmission in Communication System 2000

Figure 20:
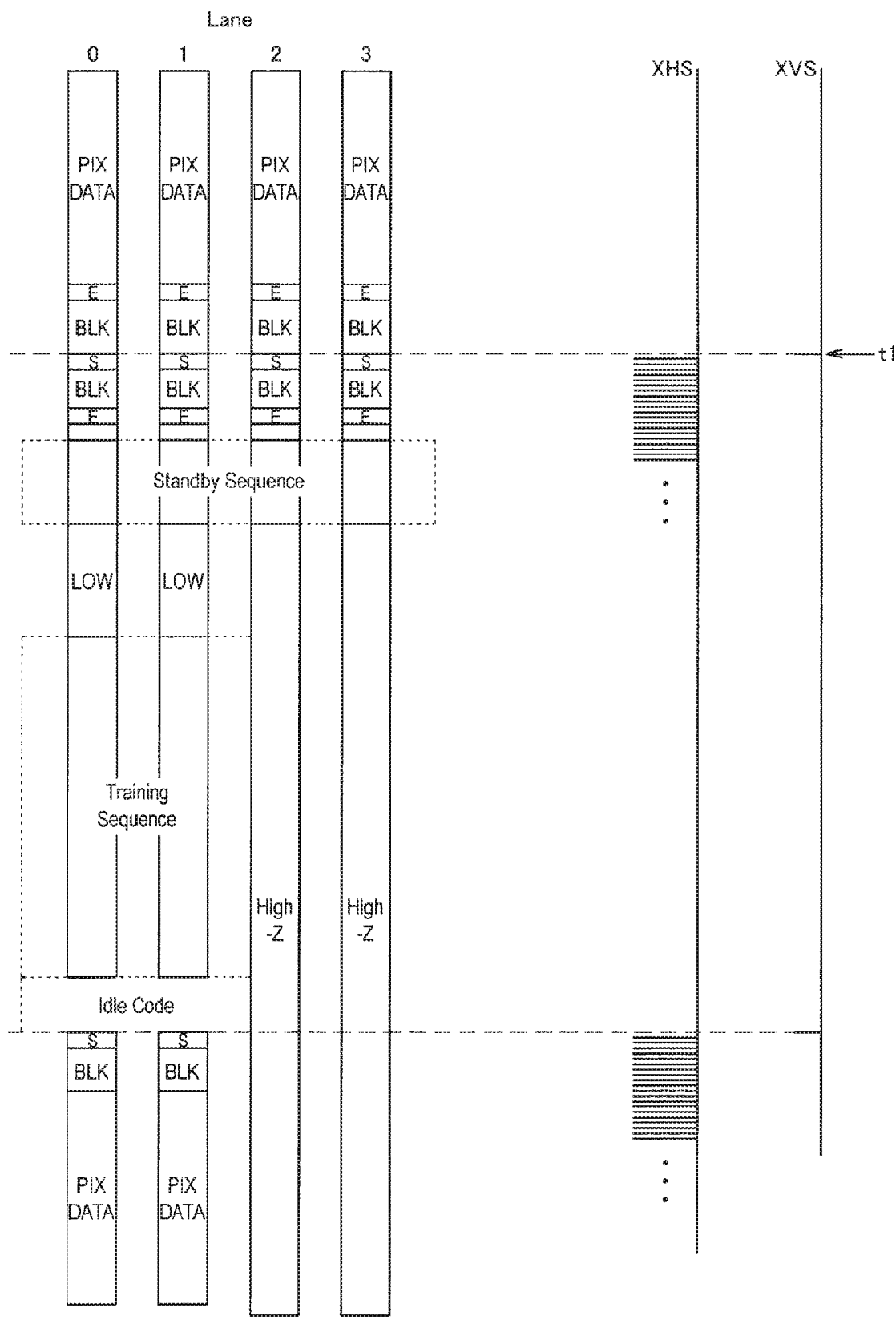
FIG. 20 is an explanatory diagram illustrating an example of data transmission in the communication system illustrated in FIG. 15.

FIG. 20 is an explanatory diagram illustrating an example of data transmission in the communication system 2000 illustrated in FIG. 15, and illustrates an example in which image data is transmitted through four transmission paths. "XVS" illustrated in FIG. 20 indicates a vertical synchronization signal, and "XHS" illustrated in FIG. 20 indicates a horizontal synchronization signal. "PIX DATA" illustrated in FIG. 20 indicates that the pixel data is being transmitted, and "E" illustrated in FIG. 20 indicates Frame End. "BLK" illustrated in FIG. 20 indicates a blanking period during which no pixel data is transmitted, and "S" illustrated in FIG. 20 indicates Frame Start.

The example will be described of data transmission in the communication system 2000 with reference to FIG. 20. The image sensor 300 transmits the pixel data of each line constituting an image of one frame in accordance with the horizontal synchronization signal until time t1 when the vertical synchronization signal is detected.

During a period of "PIX DATA" illustrated in FIG. 20 corresponding to the data transmission period, the image sensor 300 operates in the high speed mode (first operation mode). The image sensor 300 operating in the high speed mode transmits, for example, data in which the clock signal is embedded on the basis of the first clock signal (high speed clock).

Furthermore, during a period of "BLK" illustrated in FIG. 20 corresponding to the data transmission pause period, the operation is performed in the low power mode (second operation mode). The image sensor 300 operating in the low power mode transmits, for example, data in which the clock signal is embedded on the basis of the second clock signal (low speed clock).

When switching is performed from the high speed mode to the low power mode, the image sensor 300 reduces the noise of the power supply when the switching is performed from the high speed mode to the low power mode, by the power supply noise reduction circuit 106 included in the image sensor 300. Note that, also when switching is performed from the low power mode to the high speed mode, the image sensor 300 reduces the noise of the power supply when switching is performed from the low power mode to the high speed mode, by the power supply noise reduction circuit 106.

In the communication system 2000, the image sensor 300 that functions as the transmission device according to the present embodiment reduces the noise of the power supply in switching of the operation mode.

Thus, in the communication system 2000, low power consumption of the image sensor 300 is achieved while CDR synchronization in the DPS 400 is maintained. Furthermore, in the communication system 2000, the effects exhibited in the communication system according to the present embodiment described above are exhibited.

Note that, needless to say, the example of data transmission in the communication system 2000 is not limited to the example illustrated in FIG. 20.

In the above, the preferred embodiments of the present disclosure have been described in detail with reference to the accompanying drawings; however, the technical scope of the present disclosure is not limited to such examples. It is obvious that persons having ordinary knowledge in the technical field of the present disclosure can conceive various modification examples or correction examples within the scope of the technical idea described in the claims, and it is understood that the modification examples or correction examples also belong to the technical scope of the present disclosure.

Furthermore, the effects described in the present specification are merely illustrative or exemplary and not restrictive. That is, the technology according to the present disclosure can exhibit other effects obvious to those skilled in the art from the description of the present specification together with the above-described effects or in place of the above-described effects.

Note that, the following configurations also belong to the technical scope of the present disclosure.

(1)
A transmission device including:
a transmission circuit that operates, on the basis of a mode signal indicating a first operation mode corresponding to a data transmission period or a second operation mode corresponding to a data transmission pause period, in the first operation mode or the second operation mode, and transmits data in which a clock signal is embedded; and
a power supply noise reduction circuit that reduces noise of a power supply that supplies power to the transmission circuit when switching is performed between the first operation mode and the second operation mode.

(2)
The transmission device according to (1), in which the power supply noise reduction circuit reduces the noise by gradually increasing or gradually decreasing an additional current discharged from the power supply or caused to flow into the power supply, before a time point when switching is performed between the first operation mode and the second operation mode, or after the time point.

(3)
The transmission device according to (2), in which the power supply noise reduction circuit gradually increases or gradually decreases the additional current after the time point on the basis of the mode signal.

(4)
The transmission device according to (2) or (3), in which the power supply noise reduction circuit gradually increases or gradually decreases the additional current before the time point on the basis of a mode switching notice signal that notifies that switching is to be performed between the first operation mode and the second operation mode.

(5)
The transmission device according to any one of (2) to (4), in which
the power supply noise reduction circuit
includes a plurality of capacitive elements, and
reduces the noise by performing switching between connecting the plurality of capacitive elements together in series and connecting the plurality of capacitive elements together in parallel.

(6)
The transmission device according to any one of (2) to (4), in which
the power supply noise reduction circuit
includes a capacitive element and a resistive element, and
reduces the noise by performing switching between configuring a differentiating circuit with the capacitive element and the resistive element, and configuring an integrating circuit with the capacitive element and the resistive element.

(7)
The transmission device according to any one of (1) to (6), in which
the transmission circuit
generates a first clock signal corresponding to the first operation mode, or a second clock signal corresponding to the second operation mode and having a lower frequency than the first clock signal, on the basis of the mode signal, and
operates on the basis of the first clock signal or the second clock signal generated.

(8)
A communication system including:
a transmission device that transmits data in which a clock signal is embedded; and
a reception device including a clock data recovery (CDR) circuit that extracts the clock signal from the data received and generates a synchronized clock signal synchronized with the clock signal extracted, in which
the transmission device includes
a transmission circuit that operates, on the basis of a mode signal indicating a first operation mode corresponding to a data transmission period or a second operation mode corresponding to a data transmission pause period, in the first operation mode or the second operation mode, and transmits the data in which the clock signal is embedded, and
a power supply noise reduction circuit that reduces noise of a power supply that supplies power to the transmission circuit when switching is performed between the first operation mode and the second operation mode.

REFERENCE SIGNS LIST 10, 100 Transmission device
12, 102 Encoder
14, 104 Transmission circuit
16, 108 Clock signal generation circuit
18, 110 Parallel-serial conversion circuit
20, 112 Driver
106 Power supply noise reduction circuit
200 Reception device
202 Receiver circuit
204 CDR circuit
206 Serial-parallel conversion circuit
208 Decoder
300 Image sensor
302 Imaging unit
400 DSP
402 Reception unit
404 Processing unit
1000, 2000 Communication system

The invention claimed is:
1. A transmission device, comprising:
a transmission circuit configured to:
operate in one of a first operation mode or a second operation mode based on a mode signal, wherein
the mode signal indicates one of the first operation mode or the second operation mode,
the first operation mode corresponds to a data transmission period, and the second operation mode corresponds to a data transmission pause period; and transmit data in the data transmission period, wherein a clock signal is embedded in the data; and a power supply noise reduction circuit that includes a capacitive element and a resistive element, wherein the power supply noise reduction circuit is configured to:

reduce noise of a power supply that supplies power to the transmission circuit, wherein the reduction of the noise is based on a first configuration of the power supply noise reduction circuit when the transmission circuit switches from the first operation mode to the second operation mode, and the first configuration corresponds to a differentiating circuit with the capacitive element and the resistive element; and reduce the noise of the power supply based on a second configuration of the power supply noise reduction circuit when the transmission circuit switches from the second operation mode to the first operation mode, wherein the second configuration corresponds to an integrating circuit with the capacitive element and the resistive element.

2. The transmission device according to claim 1, wherein the power supply noise reduction circuit is further configured to:

reduce the noise based on one of a gradual increase or a gradual decrease in an additional current discharged from the power supply before a time point; and reduce the noise based on one of the gradual increase or the gradual decrease in the additional current discharged from the power supply after the time point, and the time point corresponds to a time at which the transmission circuit switches between the first operation mode and the second operation mode.

3. The transmission device according to claim 2, wherein the power supply noise reduction circuit is further configured to one of gradually increase or gradually decrease the additional current after the time point based on the mode signal.

4. The transmission device according to claim 2, wherein the power supply noise reduction circuit is further configured to one of gradually increase or gradually decrease the additional current before the time point based on a mode switching notice signal, and the mode switching notice signal notifies execution of a switching operation between the first operation mode and the second operation mode.

5. The transmission device according to claim 1, wherein the transmission circuit is further configured to:

generate one of a first clock signal or a second clock signal based on the mode signal, wherein the first clock signal corresponds to the first operation mode, the second clock signal corresponds to the second operation mode, and a frequency of the second clock signal is lower than a frequency of the first clock signal; and operate, in one of the first operation mode or the second operation mode, based on one of the first clock signal or the second clock signal.

6. A communication system, comprising:

a transmission device configured to transmit data, wherein a clock signal is embedded in the data; and a reception device configured to receive the data, wherein the reception device includes a clock data recovery (CDR) circuit that is configured to:

extract the clock signal from the received data; and generate a synchronized clock signal synchronized with the extracted clock signal, the transmission device includes:

a transmission circuit configured to operate in one of a first operation mode or a second operation mode based on a mode signal, wherein the mode signal indicates one of the first operation mode or the second operation mode, the first operation mode corresponds to a data transmission period, and the second operation mode corresponds to a data transmission pause period; and a power supply noise reduction circuit that includes a capacitive element and a resistive element, wherein the power supply noise reduction circuit is configured to:

reduce noise of a power supply that supplies power to the transmission circuit, wherein the reduction of the noise is based on a first configuration of the power supply noise reduction circuit when the transmission circuit switches from the first operation mode to the second operation mode, and the first configuration corresponds to a differentiating circuit with the capacitive element and the resistive element; and reduce the noise of the power supply based on a second configuration of the power supply noise reduction circuit when the transmission circuit switches from the second operation mode to the first operation mode, wherein the second configuration corresponds to an integrating circuit with the capacitive element and the resistive element.

* * * * *